(12) United States Patent
Laforet et al.

(10) Patent No.: US 10,269,953 B2
(45) Date of Patent: Apr. 23, 2019

(54) SEMICONDUCTOR DEVICE HAVING A TRENCH GATE

(71) Applicant: Infineon Technologies Austria AG, Villach (AT)

(72) Inventors: David Laforet, Villach (AT); Cedric Ouvrard, Villach (AT)

(73) Assignee: Infineon Technologies Austria AG, Villach (AT)

( * ) Notice: Subject to any disclaimer, the term of this patent is extended or adjusted under 35 U.S.C. 154(b) by 5 days.

(21) Appl. No.: 15/855,256

(22) Filed: Dec. 27, 2017

(65) Prior Publication Data

US 2018/0122934 A1      May 3, 2018

Related U.S. Application Data

(62) Division of application No. 15/292,758, filed on Oct. 13, 2016, now Pat. No. 9,865,726.

(30) Foreign Application Priority Data

Oct. 14, 2015 (DE) .................. 10 2015 117 469

(51) Int. Cl.
*H01L 29/78* (2006.01)
*H01L 21/02* (2006.01)
(Continued)

(52) U.S. Cl.
CPC ...... *H01L 29/7813* (2013.01); *H01L 21/0217* (2013.01); *H01L 21/02164* (2013.01); *H01L 21/02238* (2013.01); *H01L 21/26513* (2013.01); *H01L 21/28211* (2013.01); *H01L 29/0696* (2013.01); *H01L 29/0847* (2013.01); *H01L 29/1095* (2013.01); *H01L 29/404* (2013.01); *H01L 29/407* (2013.01);
(Continued)

(58) Field of Classification Search
CPC .......... H01L 29/4236; H01L 29/42376; H01L 29/66734; H01L 29/1095; H01L 29/407; H01L 29/41741; H01L 29/7813; H01L 29/41766; H01L 29/42368; H01L 21/26513; H01L 21/28211
See application file for complete search history.

(56) References Cited

U.S. PATENT DOCUMENTS 5,801,417 A    9/1998 Tsang et al.
6,188,105 B1   2/2001 Kocon et al.
(Continued)

FOREIGN PATENT DOCUMENTS

CN    102956481 A    3/2013
DE    102014109846 A1    1/2016
KR    101075490 B1    10/2011

*Primary Examiner* — Shahed Ahmed
(74) *Attorney, Agent, or Firm* — Murphy, Bilak & Homiller, PLLC

(57) ABSTRACT

A semiconductor device includes a gate structure extending from a first surface into a semiconductor portion and having a metal gate electrode and a gate dielectric separating the metal gate electrode from the semiconductor portion. An interlayer dielectric separates a first load electrode from the semiconductor portion, and includes a screen oxide layer thinner than the gate dielectric. A body zone and a source zone are formed in the semiconductor portion and directly adjoin the gate structure.

22 Claims, 17 Drawing Sheets

(51) Int. Cl.
*H01L 21/265* (2006.01)
*H01L 21/28* (2006.01)
*H01L 29/06* (2006.01)
*H01L 29/08* (2006.01)
*H01L 29/10* (2006.01)
*H01L 29/40* (2006.01)
*H01L 29/423* (2006.01)
*H01L 29/66* (2006.01)
*H01L 29/739* (2006.01)
*H01L 29/417* (2006.01)

(52) U.S. Cl.
CPC .... *H01L 29/4236* (2013.01); *H01L 29/66348* (2013.01); *H01L 29/66734* (2013.01); *H01L 29/7397* (2013.01); *H01L 29/7811* (2013.01); *H01L 21/02255* (2013.01); *H01L 29/0878* (2013.01); *H01L 29/41766* (2013.01); *H01L 29/4238* (2013.01)

(56) References Cited

U.S. PATENT DOCUMENTS

| | | | |
|---|---|---|---|
| 2001/0001494 A1* | 5/2001 | Kocon | H01L 29/0634 257/328 |
| 2009/0039419 A1* | 2/2009 | Zundel | H01L 29/0878 257/328 |
| 2011/0254010 A1 | 10/2011 | Zhang | |
| 2012/0061753 A1 | 3/2012 | Nishiwaki | |
| 2012/0153386 A1* | 6/2012 | Hirler | H01L 29/0623 257/334 |
| 2013/0069144 A1 | 3/2013 | Mathew et al. | |
| 2013/0075819 A1 | 3/2013 | Takei et al. | |
| 2014/0021534 A1 | 1/2014 | Verma et al. | |
| 2014/0027813 A1* | 1/2014 | Kuruc | H01L 29/66348 257/139 |
| 2014/0264908 A1 | 9/2014 | Lee et al. | |
| 2016/0020319 A1 | 1/2016 | Laforet et al. | |
| 2016/0284838 A1 | 9/2016 | Qin et al. | |

* cited by examiner

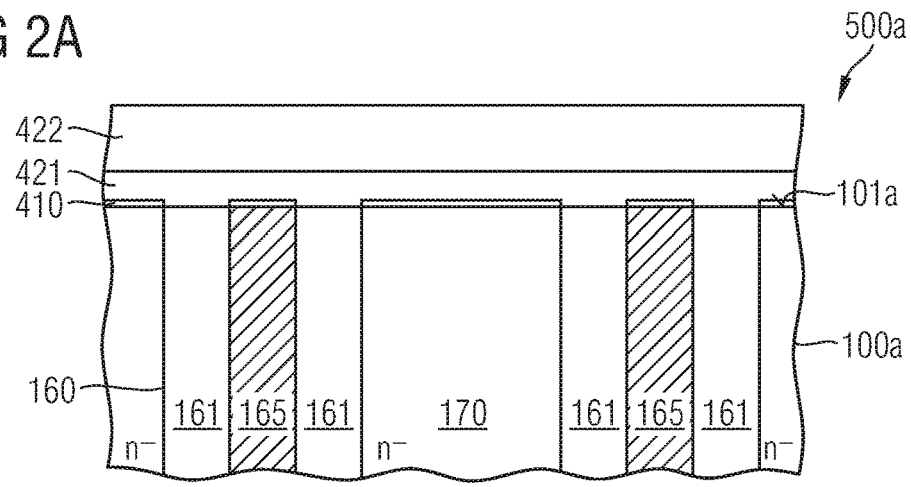
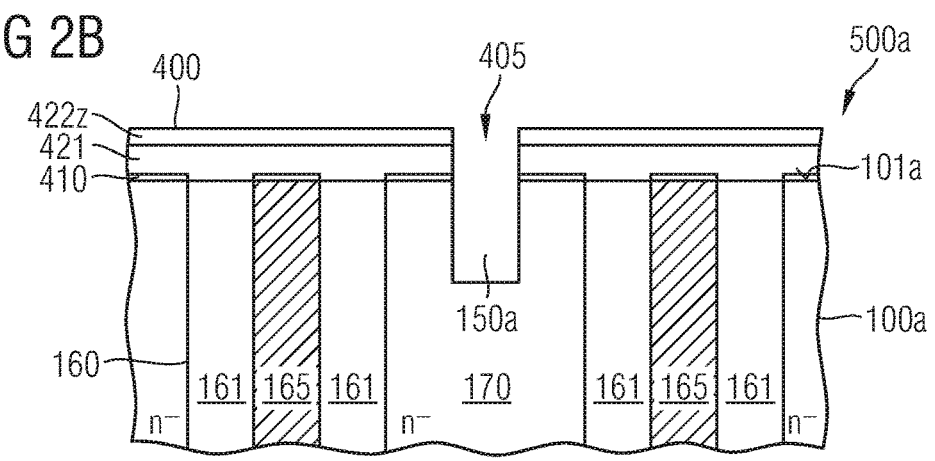
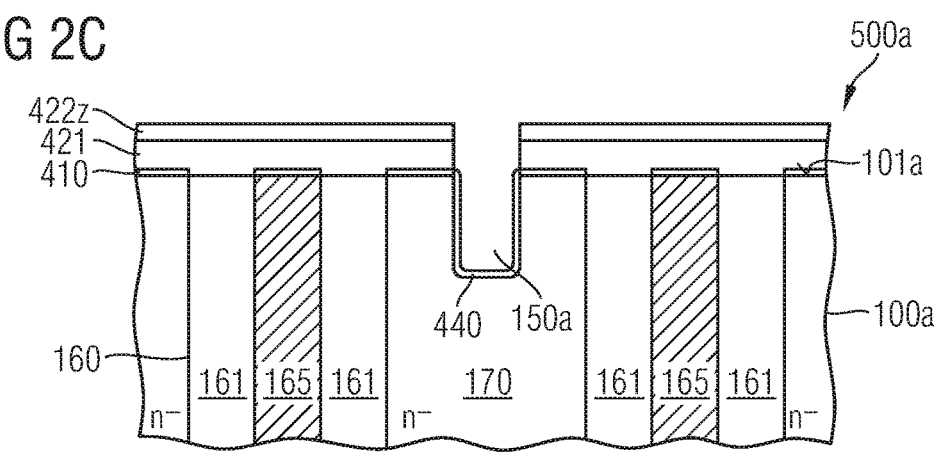

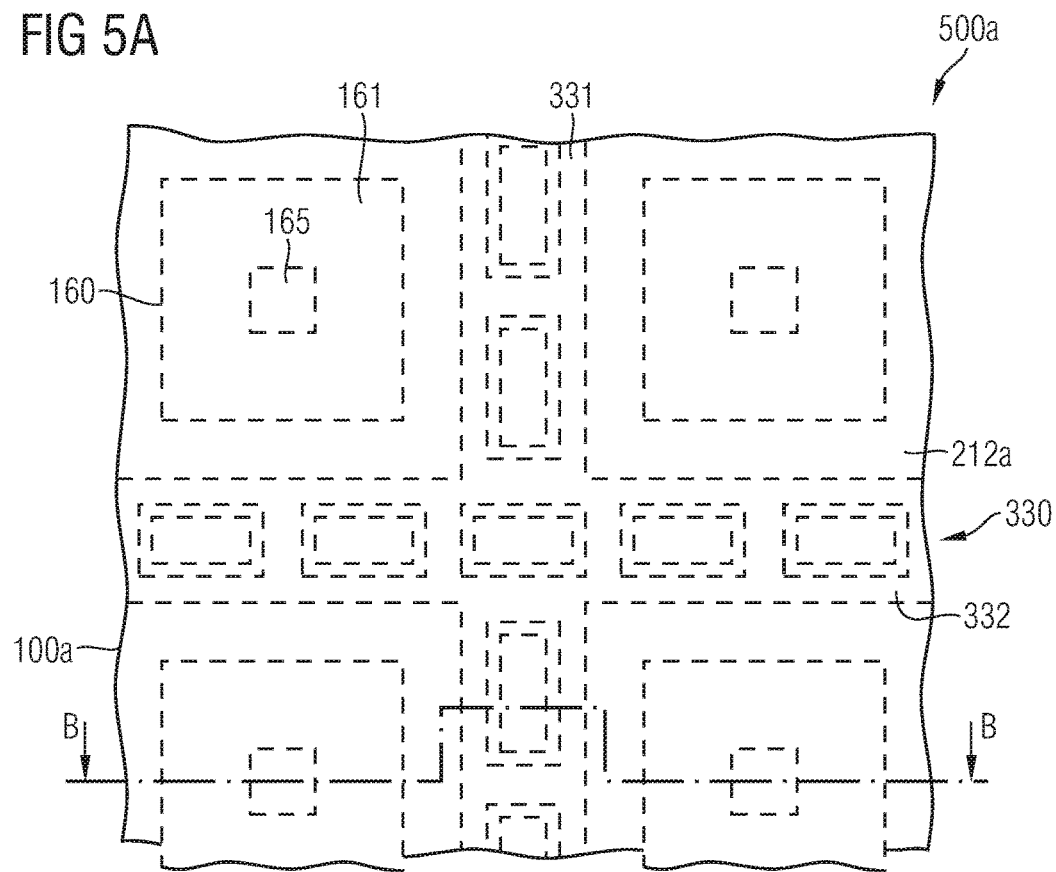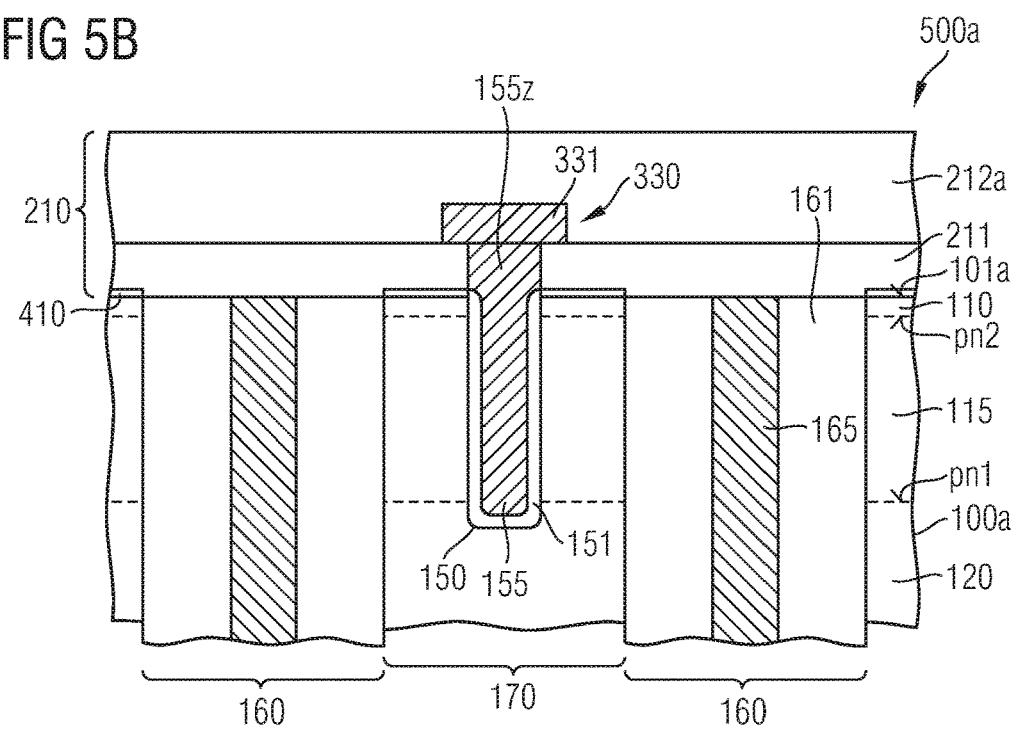

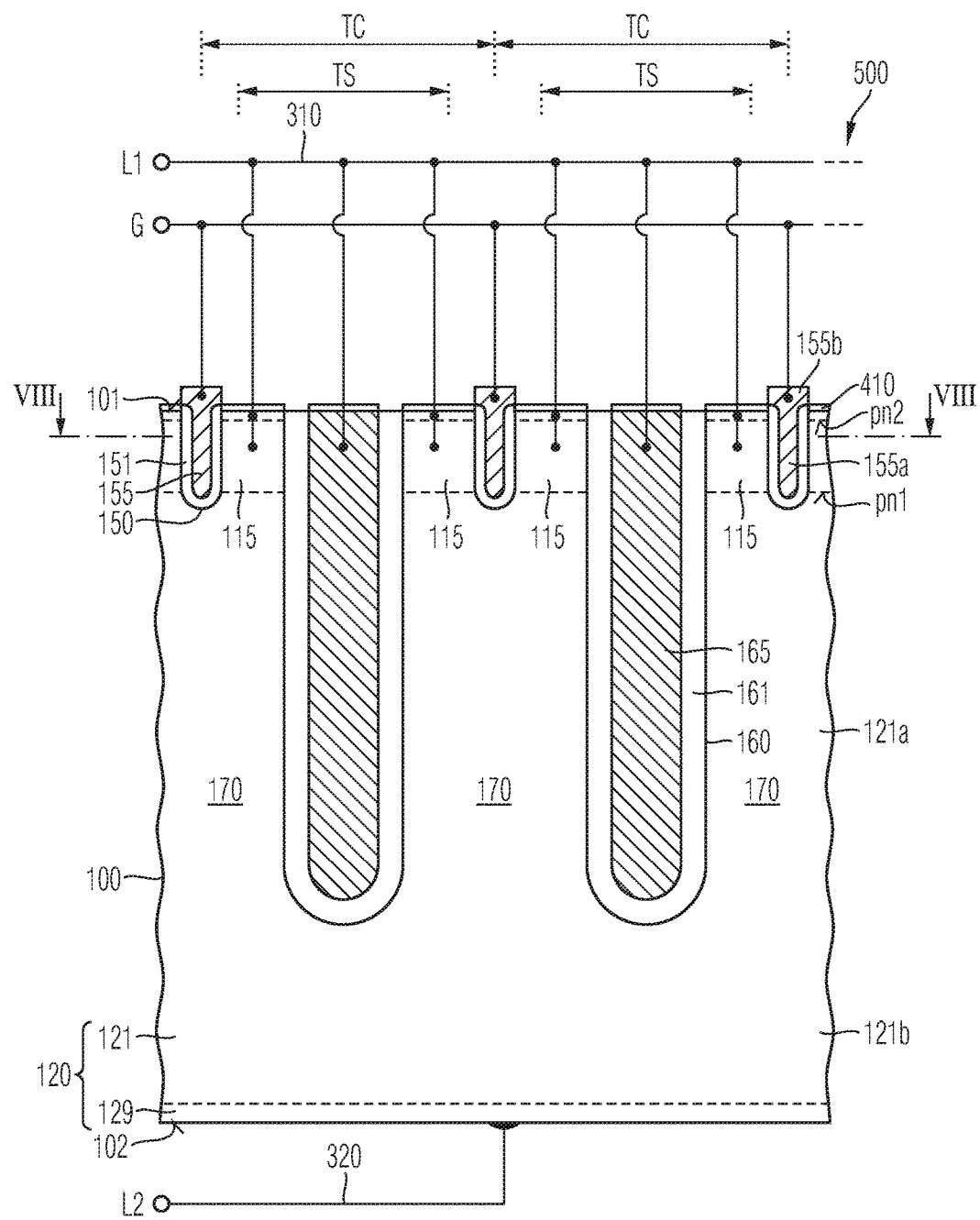

SEMICONDUCTOR DEVICE HAVING A TRENCH GATE

BACKGROUND

In power semiconductor devices, for examples IGFETs (insulated gate field effect transistors) a load current typically flows in a vertical direction between two load electrodes formed at opposite sides of a semiconductor die. In a blocking mode field plate structures extending from one side into the semiconductor die deplete a drift portion of the semiconductor die and facilitate higher dopant concentrations in the drift portion, wherein the on state resistance can be decreased without adverse impact on the blocking capability. Shrinking the field plate structures as well as gate structures increases an active transistor area.

It is desirable to improve the switching characteristics of semiconductor devices including transistor cells and field plate structures.

SUMMARY

According to an embodiment a method of manufacturing a semiconductor device includes forming a screen oxide layer on a main surface of a semiconductor layer and a passivation layer on the screen oxide layer. A gate trench is formed in a portion of the semiconductor layer exposed by a mask opening in a trench gate mask comprising the passivation layer. A gate dielectric is selectively formed along sidewalls of the gate trench. After removing the passivation layer, dopants are implanted through the screen oxide layer to form at least one of a source zone and a body zone in the semiconductor layer.

According to another embodiment a semiconductor device includes a gate structure that extends from a first surface into a semiconductor portion. The gate structure includes a metal gate electrode and a gate dielectric separating the metal gate electrode from the semiconductor portion. An interlayer dielectric separates a first load electrode from the semiconductor portion and includes a screen oxide layer that is thinner than the gate dielectric. A body zone and a source zone formed in the semiconductor portion directly adjoin to the gate structure.

According to a further embodiment a semiconductor device includes a gate structure that extends from a first surface into a semiconductor portion. The gate structure includes a metal gate electrode and a gate dielectric separating the metal gate electrode from the semiconductor portion. An interlayer dielectric separates a first load electrode from the semiconductor portion. The metal gate electrode includes a first portion extending from the main surface into the semiconductor portion and a second portion extending from the main surface into the interlayer dielectric. In the semiconductor portion a body zone and a source zone directly adjoin to the gate structure.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2A is a schematic vertical cross-sectional view of a portion of a semiconductor substrate for illustrating a method of manufacturing a semiconductor device with field plate structures according to an embodiment concerning a multi-layer trench mask, after depositing layers for the multi-layer trench mask.

FIG. 2B is a schematic vertical cross-sectional view of the semiconductor substrate portion of FIG. 2A, after forming a gate trench in a semiconductor layer.

FIG. 2C is a schematic vertical cross-sectional view of the semiconductor substrate portion of FIG. 2B, after forming a sacrificial oxide layer.

FIG. 5A is a schematic plan view of the semiconductor substrate portion of FIG. 4A, after forming an inter-metal dielectric.

FIG. 5B is a schematic vertical cross-sectional view of the semiconductor substrate portion of FIG. 5A along line B-B.

FIG. 6 is a schematic vertical cross-sectional view of a portion of a semiconductor device comprising a thick gate dielectric and a thin screen oxide layer according to an embodiment concerning a metal gate electrode with a first portion extending into a semiconductor portion and a second portion extending into an interlayer dielectric.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "$n^-$" means a doping concentration which is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1G refer to a method of manufacturing semiconductor devices using a passivation layer 420 for protecting a screen oxide layer 410 during formation of a gate dielectric 151 such that the screen oxide layer 410 can be formed prior to the gate dielectric 151.

Figure 1A:
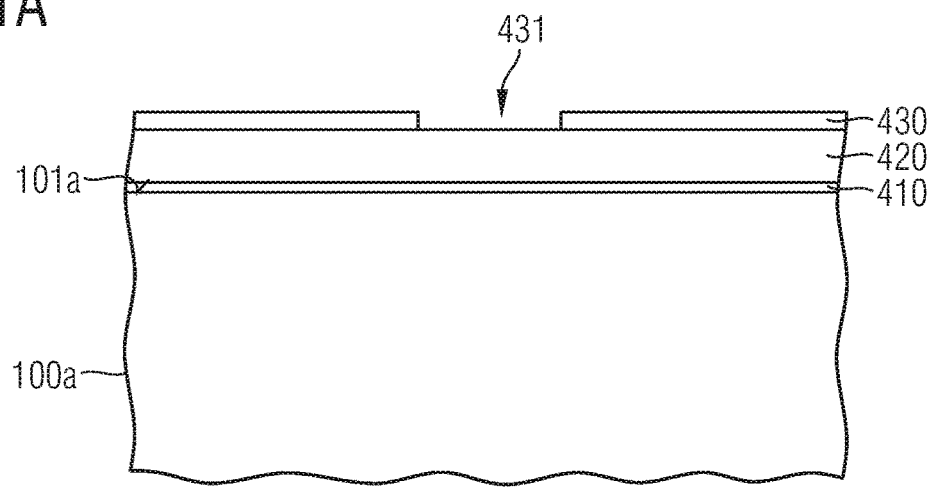
FIG. 1A is a schematic vertical cross-sectional view of a portion of a semiconductor substrate for illustrating a method of manufacturing a semiconductor device according to an embodiment passivating a screen oxide layer during formation of a gate oxide layer, after forming a resist mask defining gate trenches.

FIG. 1A shows a semiconductor substrate 500a that consists of or includes a semiconductor layer 100a of a crystalline semiconductor material. The semiconductor substrate 500a may be a semiconductor wafer from which a plurality of identical semiconductor dies is obtained. The crystalline semiconductor material of the semiconductor layer 100a may be single-crystalline silicon (Si), silicon carbide (SiC), germanium (Ge), a silicon germanium crystal (SiGe) or an $A_{III}B_V$ semiconductor.

According to an embodiment, the semiconductor layer 100a is lightly n-doped and contains, for example, phosphorus (P) and/or arsenic (As) atoms. An exposed planar main surface 101a of the semiconductor layer 100a defines a front side of the semiconductor substrate 500a. Directions parallel to the main surface 101a are horizontal directions and a direction perpendicular to the main surface 101a is a vertical direction.

The semiconductor substrate 500a may contain previously formed conductive structures, interlayer dielectrics and doped regions of electronic elements. For example, the semiconductor substrate 500a may include field plate structures.

A screen oxide layer 410 is formed by thermal oxidation on the main surface 101a, e.g., by a heating treatment in an oxygen-containing atmosphere. In case the semiconductor layer 100a is based on silicon, the screen oxide layer 410 may be a thermal silicon oxide with a thickness in a range from 5 nm to 30 nm, for example from 10 nm to 15 nm. A passivation layer 420 is formed on the screen oxide layer 410. The passivation layer 420 may be a homogeneous layer or a layer stack with two or more homogenous sub-layers of different materials. A photoresist layer is deposited on the passivation layer 420 and patterned by a photolithographic exposure process to form a resist mask 430.

FIG. 1A shows the resist mask 430 with a resist opening 431 exposing portions of a trench mask 400 that includes the passivation layer 420.

An anisotropic etch process, for example, ion beam etching forms mask openings 405 in the trench mask 400 including the passivation layer 420 and the screen oxide layer 410 in the vertical projection of the resist opening 431. A trench etch process forms a gate trench 150a in the vertical projection of the mask opening 405, wherein a portion of the trench mask 400 may be consumed.

Figure 1B:
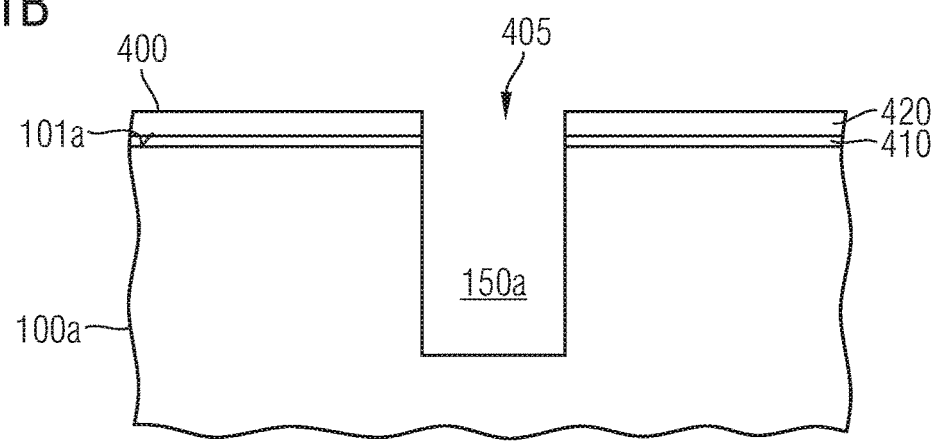
FIG. 1B is a schematic vertical cross-sectional view of the semiconductor substrate portion of FIG. 1A, after forming a gate trench in a semiconductor layer.

FIG. 1B shows the trench mask 400 after forming the gate trench 150a in the semiconductor layer 100a in the vertical projection of the mask opening 405 of the trench mask 400.

A further heating treatment in an atmosphere containing oxygen may oxidize exposed portions of the semiconductor layer 100a in the gate trench 150a.

Figure 1C:
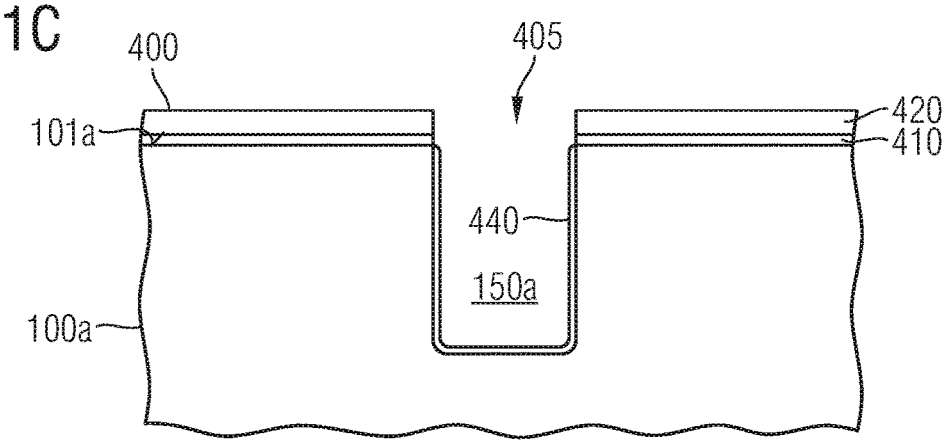
FIG. 1C is a schematic vertical cross-sectional view of the semiconductor substrate portion of FIG. 1B, after forming a sacrificial oxide layer.

FIG. 1C shows a thin sacrificial oxide layer 440 completely lining the gate trench 150a. The sacrificial oxide layer 440 may collect contaminants from adjoining portions of the semiconductor layer 100a, may smooth surface roughness, and may round corners at the bottom of the gate trench 150a. A wet etch process may remove the sacrificial oxide layer 440. A gate dielectric 151 may be formed at least along sidewalls of the gate trench 150a. Formation of the gate dielectric 151 may include a conformal deposition process, a further heating treatment in an atmosphere containing oxygen to form a semiconductor oxide layer, or a combination of both. During formation of the gate dielectric 151, for example, during the thermal oxidation process, the passivation layer 420 covers the screen oxide layer 410 such that the screen oxide layer 410 is preserved at the original layer thickness.

Figure 1D:
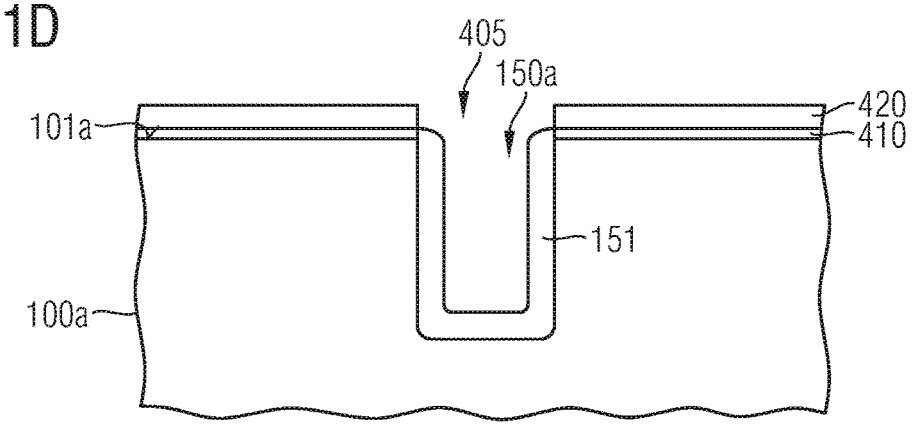
FIG. 1D is a schematic vertical cross-sectional view of the semiconductor substrate portion of FIG. 1C, after forming a gate dielectric.

FIG. 1D shows the gate dielectric 151, which may be, for example a thick silicon oxide layer with a significant greater layer thickness than the screen oxide layer 410. For example, a thickness of the gate dielectric 151 may be in a range from 30 nm to 500 nm, for example in a range from 60 nm to 100 nm.

A gate layer 156 is deposited that may contain one or more metal-containing sub-layers. For example, the gate layer 156 includes a conductive liner containing titanium (Ti) and/or tantalum (Ta), e.g., a titanium layer, a tantalum layer a titanium nitride layer or a tantalum nitride layer, as well as a conductive fill containing tungsten (W), wherein the conductive liner and the conductive fill may be successively deposited, the conductive liner may line the gate trench 150a and the conductive fill may fill at least partly a remaining void in the lined gate trench 150a.

Figure 1E:
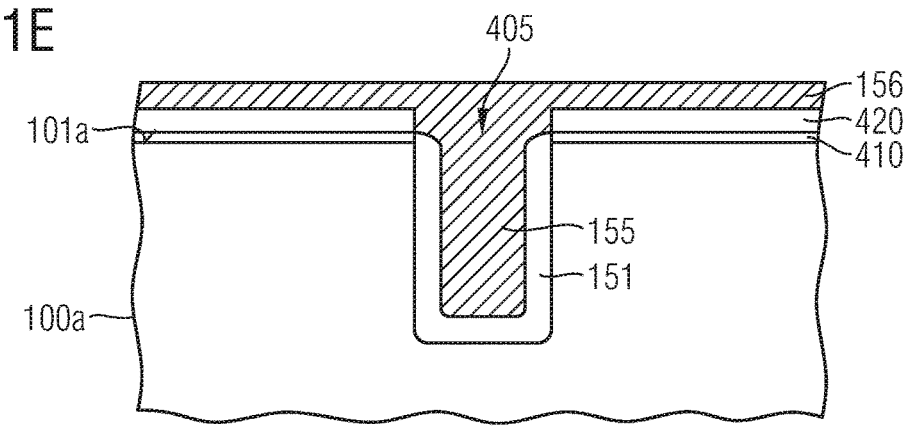
FIG. 1E is a schematic vertical cross-sectional view of the semiconductor substrate portion of FIG. 1D, after depositing a gate layer.

FIG. 1E shows the gate layer 156 filling the gate trench 150a, the mask opening 405 in remnants of the trench mask 400, and covering the passivation layer 420 outside of the mask opening 405.

Portions of the gate layer 156 deposited outside of the mask opening 405 in the trench mask 400 are removed. For example, a CMP (chemical mechanical polishing) removes portions of the gate layer 156 from above the passivation layer 420.

Figure 1F:
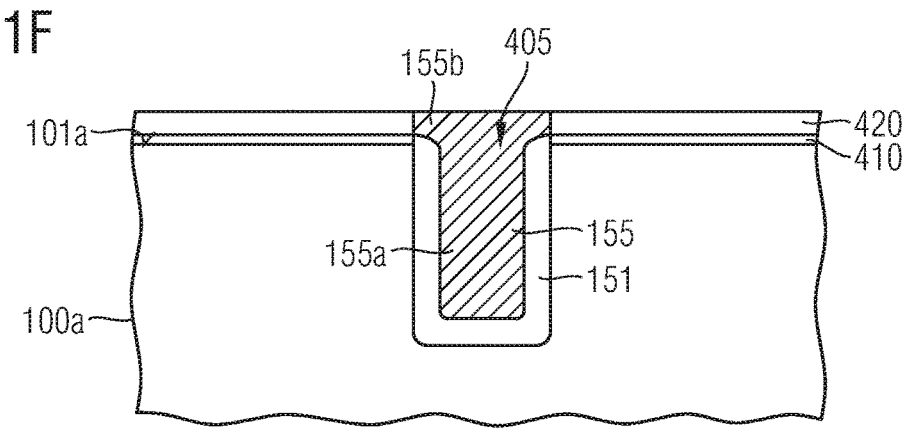
FIG. 1F is a schematic vertical cross-sectional view of the semiconductor substrate portion of FIG. 1E, after forming gate electrodes from the gate layer.

FIG. 1F shows the remaining portions of the gate layer 156 which may form a metal gate electrode 155 with a first portion 155a extending from the main surface 101a into the semiconductor layer 100a and with a second portion 155b filling the mask opening 405 in the remnant portions of the trench mask 400. The gate electrode 155 and the gate dielectric 151 form a gate structure 150 extending from the main surface 101a into the semiconductor layer 100a.

The passivation layer 420 may be removed to expose the screen oxide layer 410. Dopants may be implanted through the exposed screen oxide layer 410 to form a source zone 110 and a complementary doped body zone 115 in the semiconductor layer 100a.

Figure 1G:
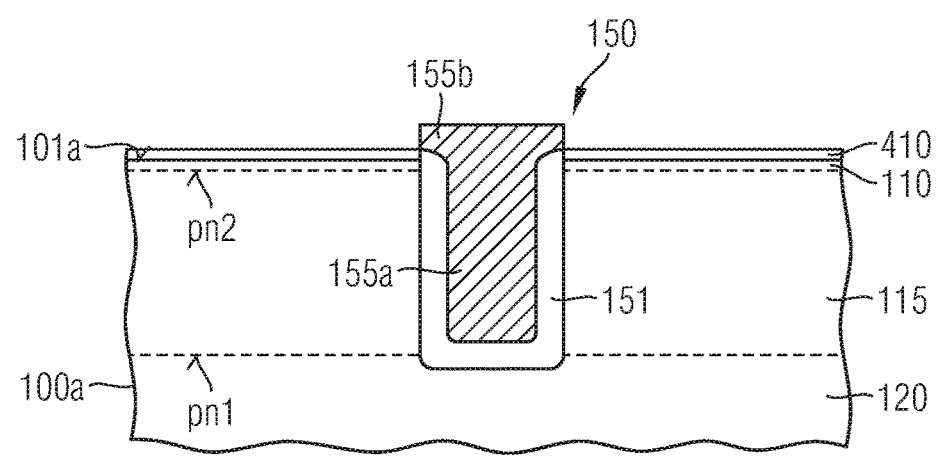
FIG. 1G is a schematic vertical cross-sectional view of the semiconductor substrate portion of FIG. 1F, after removing a passivation layer that covers the screen oxide layer during formation of the gate dielectric.

FIG. 1G shows the second portion 155b of the gate electrode 155 projecting from the main surface 101a to above an upper edge of the screen oxide layer 410. In the semiconductor layer 100a, the body zone 115 forms a first pn junction pn1 with a drift structure 120 formed between the gate structure 150 and a rear side of the semiconductor substrate 500a. In addition, the body zone 115 forms a second pn junction pn2 with the source zone 110. Implanting the dopants for the source zone 110 through the thin screen oxide layer 410 allows for forming a comparatively shallow source zone 110 with a vertical extension of less than 200 nm, e.g., less than 150 nm.

Apart from gettering contaminants, the screen oxide layer 410 partially randomizes the ion flux during the implant such that ion channeling is reduced. Since the formation process of the screen oxide layer 410 results in high layer uniformity and since the passivation layer 420 protects the screen oxide layer 410 during formation of the gate structure 150, the thickness of the screen oxide layer 410 is highly uniform also during the implant such that the method avoids variation of implant depth which typically results in non-uniform device characteristics across the semiconductor substrate 500a.

Since the layer thickness of the screen oxide layer 410 is decoupled from the thickness of the gate dielectric 151, the screen oxide layer 410 may be significantly thinner than the gate dielectric 151 and therefore allows shallower implants. The shallow source zone 110 results in only low vertical overlap with the gate electrode 155, low gate charge, and low gate-to-source capacitance.

By contrast, when implanting the dopants for the source and body zones 110, 115 before deposition of the material of the gate electrode 155, the thermal budget applied for forming the gate dielectric and the gate electrode is effective on the implanted dopants, spreads the dopant profiles, and results in strongly diffused source and body zones. The resulting deep source zones typically result in high gate charge that adversely affects the device parameters.

On the other hand, forming a screen oxide layer by thermal oxidation of the semiconductor layer 100a only after formation of the gate structure 150 is effective also on the material of the gate electrode 155. In case the gate electrode 155 contains or consists of metals, oxidation of exposed portions of the gate material adversely affects the characteristics of such metal gate electrode 155.

Exposing the deposited and exposed gate material to a thermal oxidation for formation of a screen oxide layer may be avoided by using portions of a gate oxide layer previously formed on the main surface 101a during formation of the gate dielectric 151 as screen oxide layer.

But typically, a gate oxide layer has a thickness of more than 50 nm. A thick screen oxide layer of the same thickness needs high implant energy that in turn results in broad implant distribution around the peak implantation depth. Hence a screen oxide layer of the same thickness as the gate dielectric typically results in comparatively deep implant profiles, high gate charge and high gate-to-source capacitance.

Using a polishing process to thin portions of a gate dielectric 151 formed on the main surface 101a to form a screen oxide layer 410 thinner than the gate dielectric 151 in the gate structure 150 adversely affects the uniformity of the resulting screen oxide layer. The non-uniformity of the screen oxide layer obtained by thinning the portions of the gate dielectric 151 on the main surface 101a results in a non-uniform implant profile for the source zone 110 and, due to variations of the gate charge Qg, in non-uniform device performance across the semiconductor substrate 500a.

Instead of using a screen oxide layer, ion channeling may be avoided by using a tilted implant without any oxide layer formed on the main surface 101a. But complete removal of portions of a gate oxide layer from the main surface 101a weakens a remnant portion of the gate dielectric 151 at the edge between gate structure 150 and the main surface 101a. Since an oxidation process for re-strengthening the locally weakened gate dielectric 151 adversely affects an exposed metal gate, an etch process typically recesses the gate electrode 155 to below the weak gate dielectric portion in order to avoid reliability issues. The recess of the gate electrode adds process complexity.

By contrast, forming the screen oxide layer 410 before the gate structure 150 allows for combining metal gate electrodes 155 with shallow implants for the source zones 110 at low additional effort and without adversely affecting gate dielectric reliability. The vertical dimensions of the body and source zones 115, 110 can be precisely controlled because the concerned dopants are implanted through the thin and highly uniform screen oxide layer 410, which allows formation of a source zone 110 with a small vertical dimension of, e.g. less than 200 nm, e.g., less than 150 nm. The shallow source zone 110 may also allow for reducing the vertical dimension of the gate structure 150, since the first pn junction pn1 between the body zone 115 and the drift structure 120 may be formed closer to the main surface 101a. The shallower first pn junction pn1 allows also for a shallower field plate. The process gets along without recess of the gate electrode 155 for avoiding dielectric reliability issues at the corner between the gate structure 150 and the main surface 101a. Avoiding a recess of the gate electrode 155 results in reduced manufacturing costs, in reduced process complexity as well as in reduced gate charge variation across the semiconductor substrate 500a.

FIGS. 2A to 2I refer to an embodiment concerning the manufacture of semiconductor devices with needle-shaped or spicular field electrodes. The description of FIGS. 2A to 2I focuses on the differences to the method described with reference to FIGS. 1A to 1G. Materials as well as processes discussed in detail above may be also applied to the method of FIG. 2A to 2I.

FIG. 2A shows a semiconductor substrate 500a that consists of or includes a semiconductor layer 100a of a crystalline semiconductor material as described above.

Field plate structures 160 extend from the main surface 101a into the semiconductor layer 100a. Each field plate structure 160 includes a conductive stripe-shaped or spicular field electrode 165 as well as a field dielectric 161 surrounding the field electrode 165. The field electrodes 165 include or consist of a heavily doped polycrystalline silicon layer and/or a metal containing layer. The field dielectric 161 separates the field electrodes 165 from the surrounding semiconductor material of the semiconductor layer 100a and may include or consist of a thermally grown silicon oxide layer, a deposited silicon oxide layer, e.g., a silicon oxide based on TEOS, or a combination of both.

Cross-sectional areas of the field electrodes 165 and the field plate structures 160 may be stripes with a first horizontal extension exceeding at least ten times a second horizontal extension orthogonal to the first horizontal extension. According to the illustrated embodiment, the cross-sectional areas of the field electrodes 165 and the field plate structures 160 are dot-shaped with a first horizontal extension exceeding the second horizontal extension at most three times. For example, the cross-sectional areas may be regular or distorted polygons such as rectangles, hexagons or octagons with or without rounded and/or beveled corners, respectively. According to an embodiment, the first and second horizontal extensions are approximately equal and the cross-sectional areas of the field electrodes 165 and the field plate structures 160 are regular polygons such as octagons, hexagons or squares with or without rounded and/or beveled corners, respectively.

According to other embodiments, the cross-sectional areas of the field electrodes 165 and the field plate structures 160 may be ellipses or ovals, or, in case the first and second horizontal extensions are equal, circles.

A minimum horizontal extension of the field electrodes 165 may be in a range from 0.1 µm to 20 µm, for example in a range from 0.2 µm to 5 µm. A vertical extension of the field plate structures 160 may be in a range from 1 µm to 50 µm, for example in a range from 2 µm to 20 µm.

Buried bottom sections of the field plate structures 160 may be approximately horizontal or may be rounded. Vertical sidewall sections of the field plate structures 160 between the main surface 101a and the bottom section may be strictly vertical, may slightly taper and/or may be bulgy.

Portions of the semiconductor layer 100a between neighboring field plate structures 160 form mesa sections 170. The mesa sections 170 may be stripe-shaped or may form a grid embedding single spicular field plate structures 160 in each mesh. A minimum mesa width may be in a range from 300 nm to 1 µm, for example in a range from 400 nm to 800 nm.

After finalizing the formation of the field plate structures 160, for example after a CMP stopping at the main surface 101a, a screen oxide layer 410 is formed by thermal oxidation. A thickness of the screen oxide layer may be in a range from 5 nm to 30 nm, for example in a range from 10 nm to 15 nm. A passivation layer 420 is deposited on the screen oxide layer 410. The passivation layer 420 may include a protection layer 421, for example a silicon nitride layer with a thickness in a range from 10 nm to 200 nm, e.g., from 20 nm to 100 nm. The passivation layer 420 may also include a trench mask layer 422 deposited on the protection layer 421. The trench mask layer 422 may be a layer containing silicon and oxygen, for example a deposited silicon oxide such as TEOS-silicon oxide resulting from chemical vapor deposition using tetraethylorthosilicate as precursor material or doped or undoped silicate glass, such as BSG (boron silicate glass), PSG (phosphorus silicate glass), BPSG (boron phosphorus silicate glass), or others.

FIG. 2A shows the field plate structures 160 separated by mesa sections 170. The screen oxide layer 410 is formed at least on portions of the main surface 101a formed by the mesa sections 170 and may also be formed on the field electrodes 165 in case the field electrodes 165 are of polycrystalline silicon. The passivation layer 420 including the protection layer 421 and the trench mask layer 422 is formed on the screen oxide layer 410.

A patterning process, for example, a lithographic exposure process exposes central sections of the mesa sections 170 between neighboring field plate structures 160. A trench etch process using, e.g., reactive ion etching forms gate trenches 150a in the mesa sections 170 of the semiconductor layer 100a in the vertical projection of mask openings 405 in a trench mask 400 including the protection layer 421 and the trench mask layer 422. Etching the gate trenches 150a may partially or completely consume the trench mask layer 422.

FIG. 2B shows the trench mask 400 with the possible trench mask layer remnants 422z and the protection layer 421. The gate trenches 150a are formed in the center of the mesa sections 170. Each gate trench 150a may be stripe-shaped and may extend between and parallel to a pair of neighboring stripe-shape field plate structures 160 or between and parallel to two lines of needle-shaped field plate structures 160. According to another embodiment a plurality of spatially separated gate trenches 150a is formed along a center line of the mesa section 170 between and parallel to two neighboring stripe-shaped field plate structures 160 or between and parallel to two neighboring lines of needle-shaped field plate structures 160. According to other embodiments, the gate trench 150a forms a continuous grid with the field plate structures 160 formed in the meshes of the grid, respectively, or a plurality of separated gate trenches 150a are formed arranged along grid lines of a grid with the field plate structures 160 formed in meshes of the grid.

A sacrificial oxide 440 may be formed on at least sidewalls of the gate trench 150a.

FIG. 2C shows the thin sacrificial oxide layer 440 lining the gate trench 150a. During formation of the sacrificial oxide layer 440, the protection layer 420 covers the field electrode 165, which may be covered by a portion of the screen oxide layer 410, such that formation of the sacrificial oxide layer 440 has only low impact on the resistance of the field electrodes 165.

The sacrificial oxide layer 440 as well as possible trench mask layer remnants 422z may be removed, for example in a wet etch process.

Figure 2D:
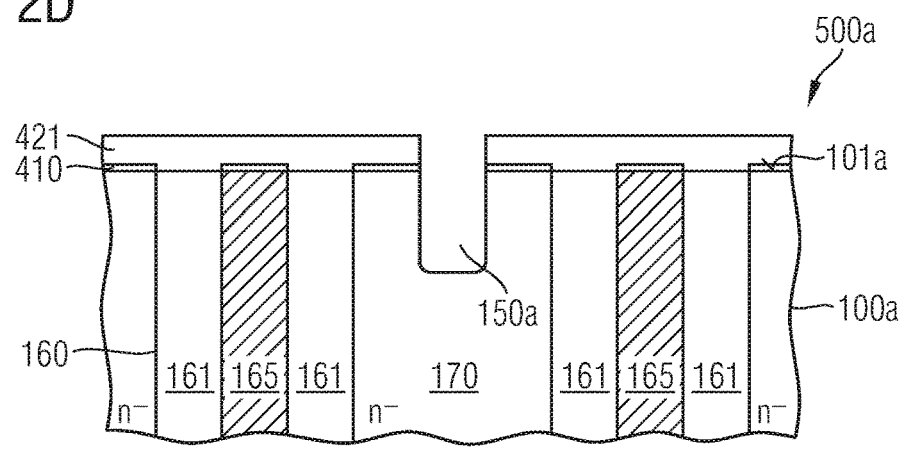
FIG. 2D is a schematic vertical cross-sectional view of the semiconductor substrate portion of FIG. 2C, after removing the sacrificial oxide layer.

FIG. 2D shows the gate trench 150a after removal of the sacrificial oxide layer 440 of FIG. 2C. Formation and removal of the sacrificial oxide layer 440 of FIG. 2C smoothens the sidewalls of the gate trench 150a, rounds corners at the bottom of the gate trench 150a and, as a consequence, increases reliability of a gate dielectric 151 formed in the following. After removal of the possible trench mask layer a remnant portion of the passivation layer 420 may include not more than the protection layer 421 and the original thickness of the protection layer defines the height of the remnant portion of the passivation layer 420.

A gate dielectric 151 is formed along sidewalls of the gate trench 150a. The formation of the gate dielectric 151 may include a thermal oxidation of the material of the semiconductor layer 100a, a deposition of a dielectric material, or a combination of both. During formation of the gate dielectric 151, the protection layer 420 covers the field electrode 165, which may be covered by a portion of the screen oxide layer 410, such that formation of the gate dielectric 151 has only low impact on the resistance of the field electrodes 165.

Figure 2E:
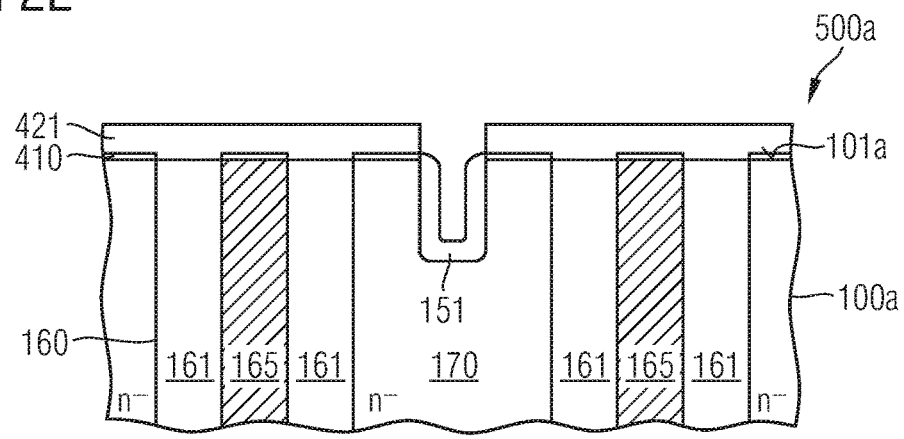
FIG. 2E is a schematic vertical cross-sectional view of the semiconductor substrate portion of FIG. 2D, after forming a gate dielectric.

FIG. 2E shows a gate dielectric 151 exclusively formed by a heating treatment in an oxygen-containing atmosphere. The layer thickness of the gate dielectric 151 is at least twice a layer thickness of the screen oxide layer 410. According to an embodiment, the thickness of the gate dielectric 151 is in a range from 40 nm to 250 nm, for example in a range from 60 nm to 100 nm.

A gate layer 156 is deposited that at least partly fills the gate trenches 150a lined by the gate dielectric 151.

Figure 2F:
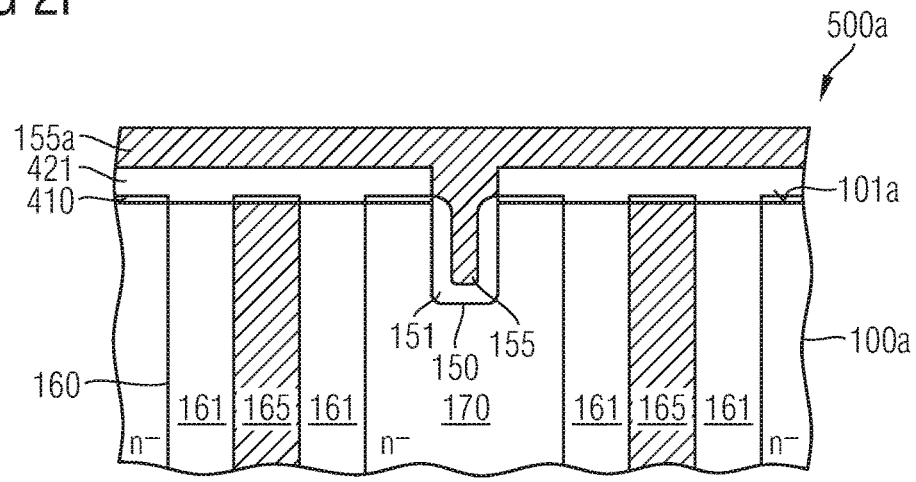
FIG. 2F is a schematic vertical cross-sectional view of the semiconductor substrate portion of FIG. 2E, after depositing a gate layer.

FIG. 2F shows the gate layer 156, which may be a homogeneous layer from one single material or which may include a layer stack including a conductive liner and a conductive fill as described above with reference to FIG. 1D.

CMP may remove portions of the gate layer 156 deposited outside of the gate trench 150a and outside of the opening in the protection layer 421.

Figure 2G:
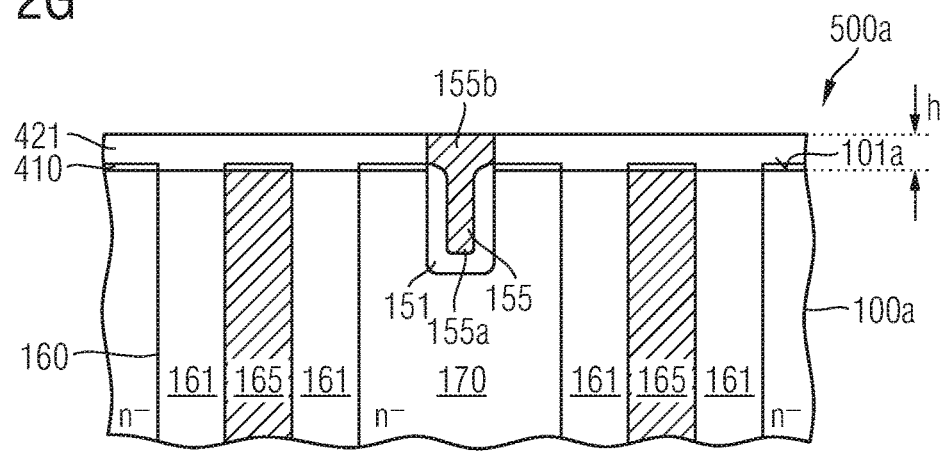
FIG. 2G is a schematic vertical cross-sectional view of the semiconductor substrate portion of FIG. 2F, after forming a metal gate electrode from the gate layer.

FIG. 2G shows the gate electrode 155 with a first portion 155a extending from the main surface 101a into the mesa section 170 and with a second portion 155b filling the opening in the remnant portion of the passivation layer 420, wherein the remnant portion of the passivation layer 420 may consist of the protection layer 421 only. A vertical extension h of the second portion 155b corresponds to the total height of the remnant portion of the passivation layer 420 and the screen oxide layer 410. By using the a combination of trench mask layer 422 and protection layer 421, the thickness of the remnant portion of the passivation layer 420 is equal to the sum of the thickness of the protection layer 421 and the screen oxide layer 410 such that the vertical extension h of the second portion 155b can be defined with high uniformity across the semiconductor substrate 500a and among a plurality of semiconductor substrates 500a.

The remnant portion of the passivation layer 420, e.g., the protection layer 421 is removed selectively to the screen oxide layer 410 and the gate electrode 155.

Figure 2H:
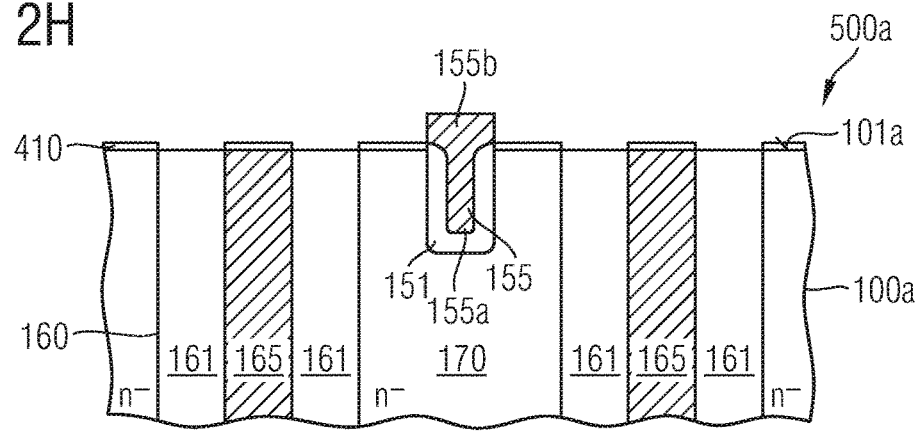
FIG. 2H is a schematic vertical cross-sectional view of the semiconductor substrate portion of FIG. 2G, after removing the passivation layer covering the screen oxide layer during formation of the gate dielectric.

FIG. 2H shows the exposed screen oxide layer 410. Since removal of the protection layer 421 is highly selective to the material of the gate dielectric 151, which is also covered by the second portion 155b of the gate electrode 155, the gate dielectric 151 remains protected and formation of weak spots in the gate dielectric 151 can be avoided.

Dopants are implanted through the exposed screen oxide layer 410 to form shallow source zones 110 and body zones 115 separating the source zones 110 from a drift structure 120 formed in further portions of the mesa sections 170.

Figure 2I:
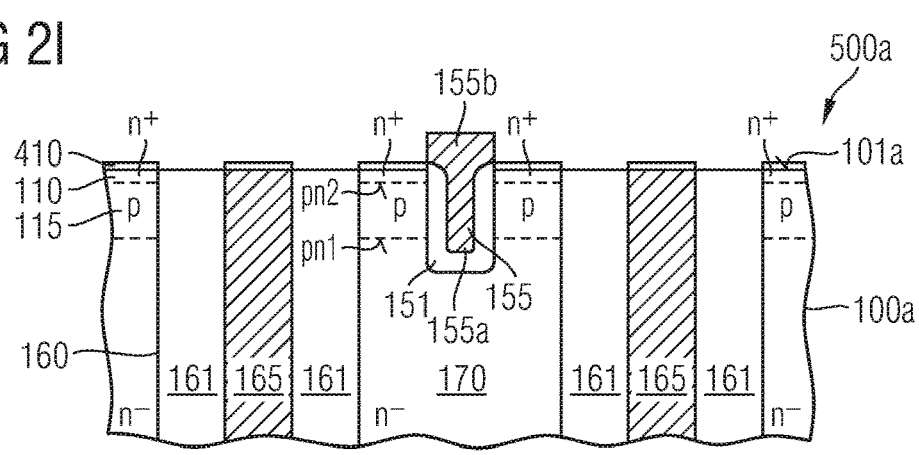
FIG. 2I is a schematic vertical cross-sectional view of the semiconductor substrate portion of FIG. 2H, after forming source and body zones in the semiconductor layer.

FIG. 2I shows the body zones 115 that form first pn junctions pn1 with the drift structure 120 and second pn junctions with the source zones 110.

FIGS. 3A to 5B refer to a gate wiring 330 electrically connecting separated gate electrodes 155 with second portions 155b projecting from the main surface 101a as described with reference to the preceding FIGS.

Figure 3A:
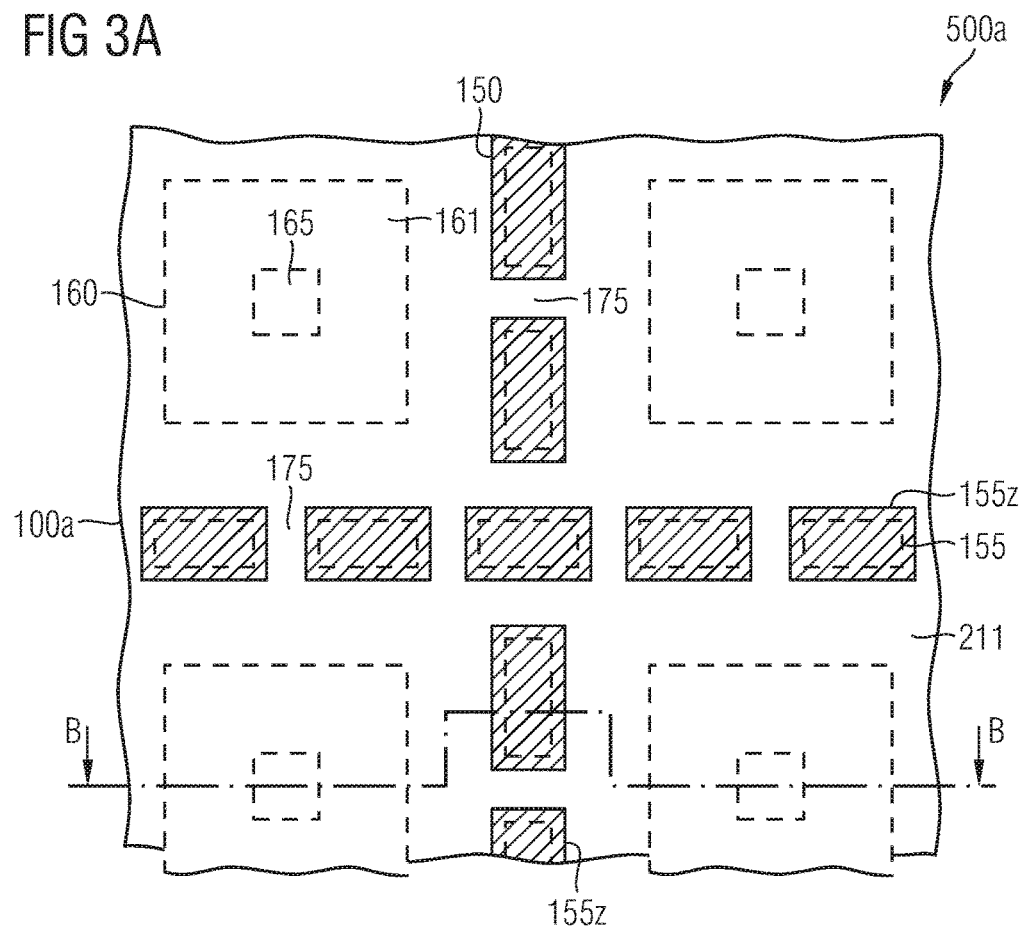
FIG. 3A is a schematic plan view of a portion of a semiconductor substrate including needle-shaped field electrodes for illustrating a method of manufacturing a semiconductor device according to a further embodiment, after forming a pre-metallic dielectric embedding a second portion of the gate electrode.
Figure 3B:
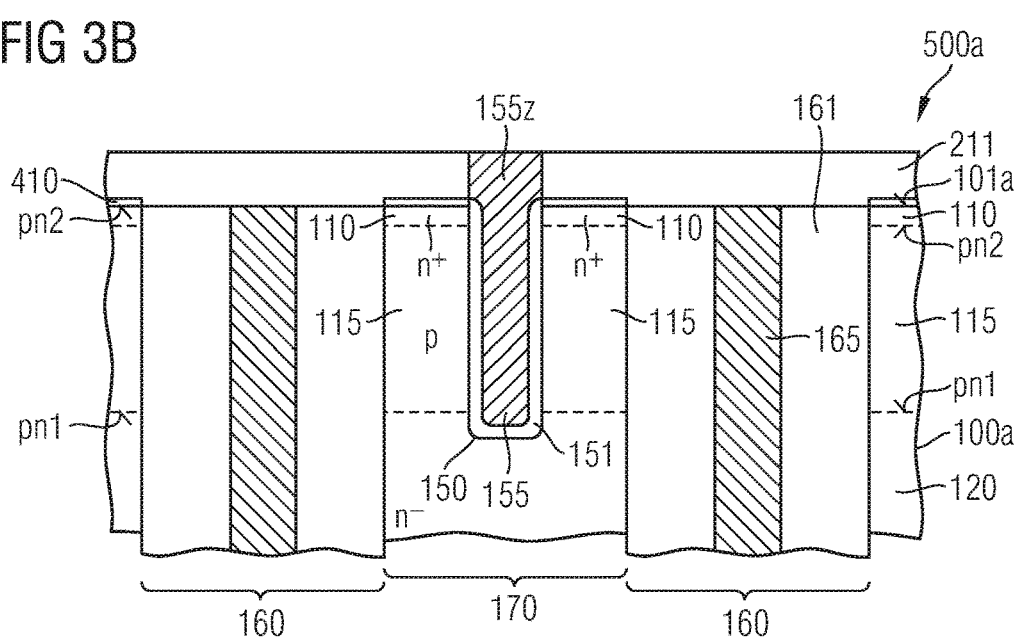
FIG. 3B is a schematic vertical cross-sectional view of the semiconductor substrate portion of FIG. 3A along line B-B.

FIGS. 3A and 3B refer to a semiconductor substrate 500a with spicular field plate structures 160 separated by mesa sections 170 that form a grid embedding the needle-shaped field plate structures 160. The mesa sections 170 include body zones 115 forming first pn junctions pn1 with a drift structure 120 and second pn junctions pn2 with source zones 110 formed between the main surface 101a and the body zones 115. A plurality of separated gate structures 150 extend into the mesa sections 170. Each gate structure 150 includes a gate dielectric 151 formed by deposition of a dielectric liner, by thermal oxidation of the material of the semiconductor layer 100a, or by a combination of both. Each gate structure 150 includes a conductive gate electrode composed of one or more conductive materials, for example a conductive liner containing metals and a conductive fill material containing second metal, wherein the conductive liner may be formed along the gate dielectric 151 and the conductive fill material fills at least partly the remaining void in the gate structure 150. A second portion 155b of each gate electrode 155 protrudes from the main surface 101a. A screen oxide layer 410 may cover the mesa sections 170. A pre-metal dielectric material may be deposited on the main surface 101a or on the screen oxide layer 410 and is polished to an upper edge of the second portion 155b of the gate electrodes 155.

FIG. 3B shows a pre-metal dielectric 211 formed on the main surface 101a or on the screen oxide layer 410. A vertical extension of the pre-metal dielectric 211 results from o a vertical extension of the second portions 155b of the gate electrodes 155. The pre-metal dielectric 211 may include one or more dielectric layers from silicon oxide, silicon nitride, silicon oxynitride, doped or undoped silicate glass, for example BSG, PSG, BPSG or TEOS silicon oxide.

A further conductive layer from a conductive material, for example aluminum (Al), copper (Cu), or W is deposited on the pre-metal dielectric 211. From the further conductive layer, a photolithography process forms a gate wiring 330 in the vertical projection of the separated gate structures 150.

Figure 4A:
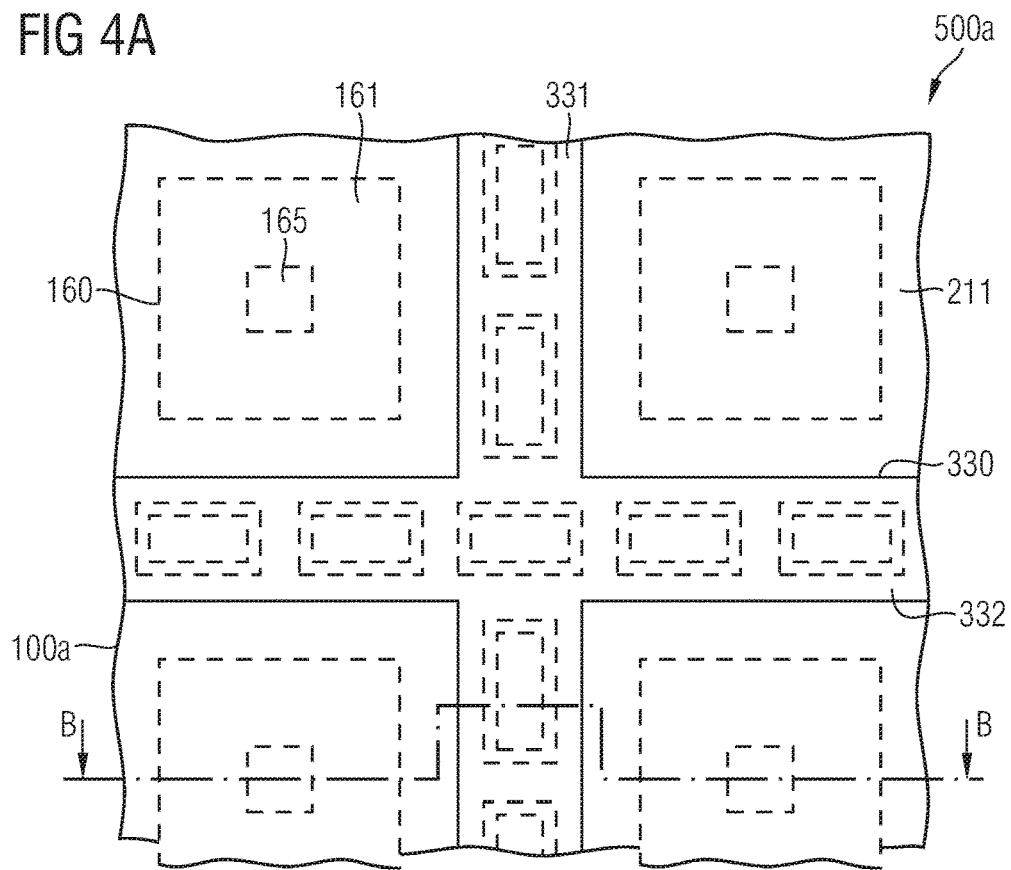
FIG. 4A is a schematic plan view of the semiconductor substrate portion of FIG. 3A, after forming a gate wiring on the gate electrode.
Figure 4B:
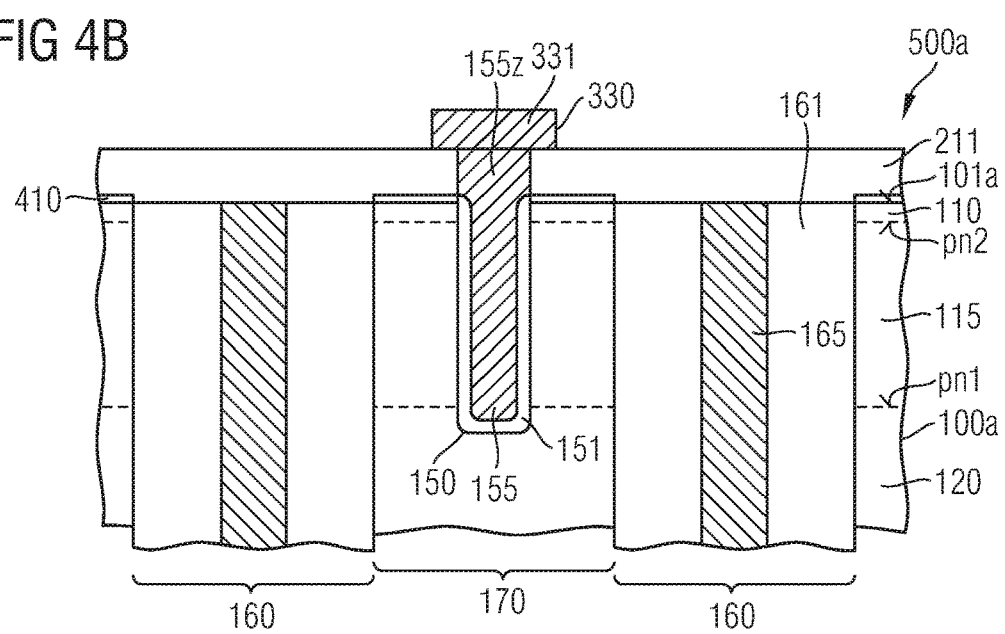
FIG. 4B is a schematic vertical cross-sectional view of the semiconductor substrate portion of FIG. 4A along line B-B.

FIGS. 4A and 4B show the gate wiring 330 forming a grid with first wiring sections 331 running along a first horizontal direction and with second wiring sections 332 running along a second, orthogonal horizontal direction.

An inter-metal dielectric 212 is deposited on the gate wiring 330 and the pre-metal dielectric 211.

The inter-metal dielectric 212 as illustrated in FIGS. 5A and 5B may include one or more dielectric layers from silicon oxide, silicon nitride, silicon oxynitride, doped or undoped silicate glass, for example BSG, PSG or BPSG.

Figure 7A:
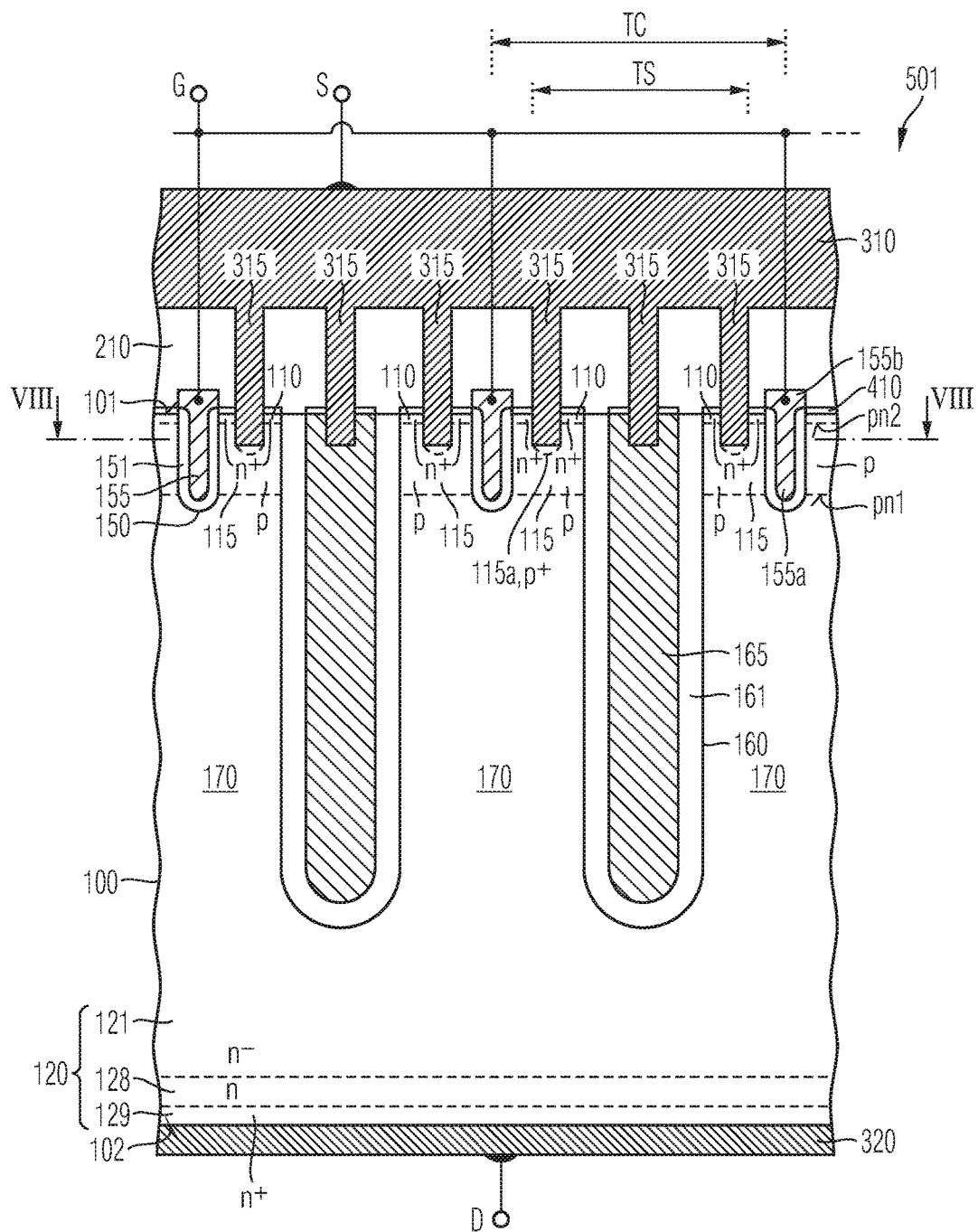
FIG. 7A is a schematic vertical cross-sectional view of a portion of an IGFET according to an embodiment with an interlayer dielectric including a screen oxide layer.
Figure 7B:
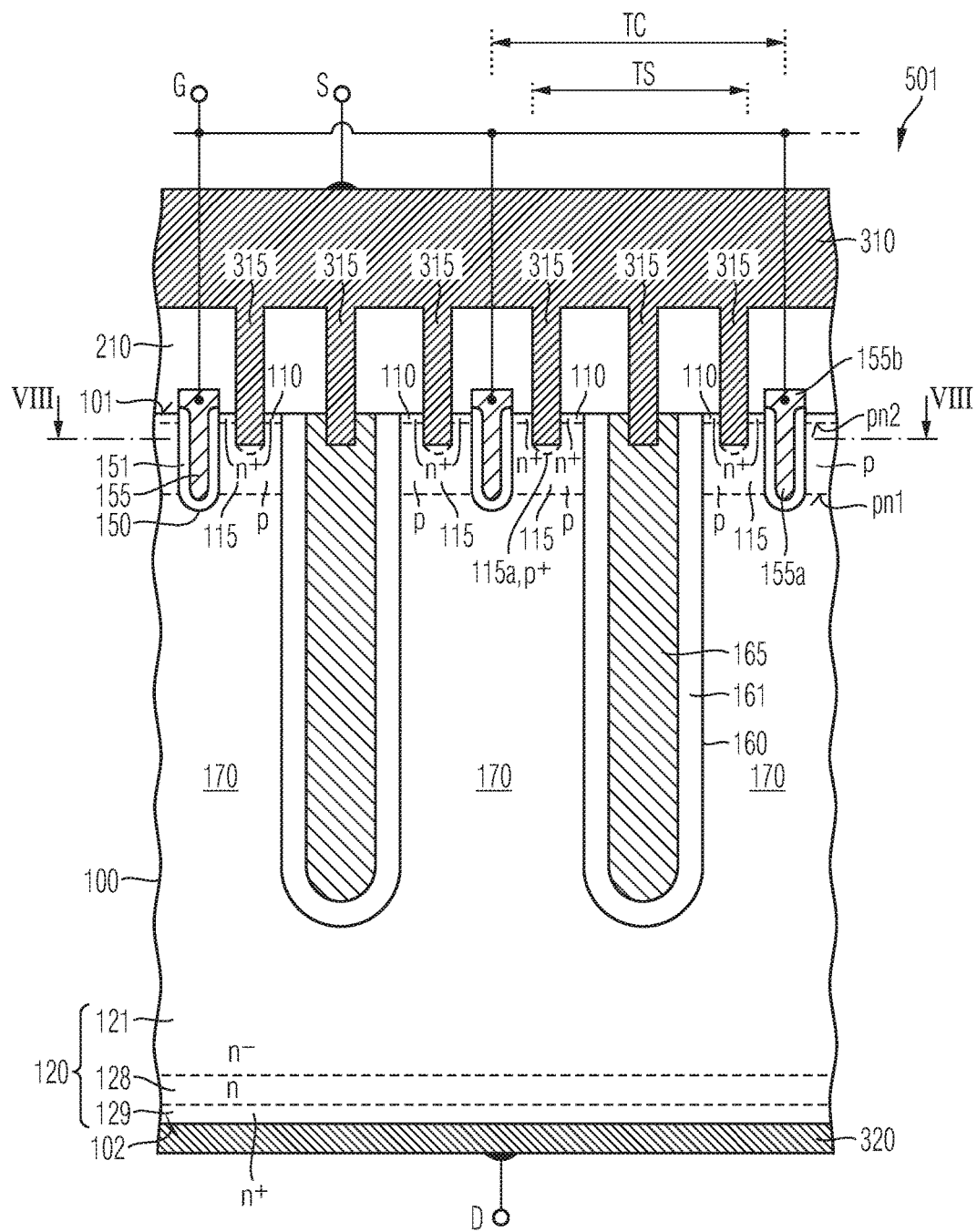
FIG. 7B is a schematic vertical cross-sectional view of a portion of an IGFET according to an embodiment including a gate electrode with a second portion projecting into an interlayer dielectric.
Figure 7C:
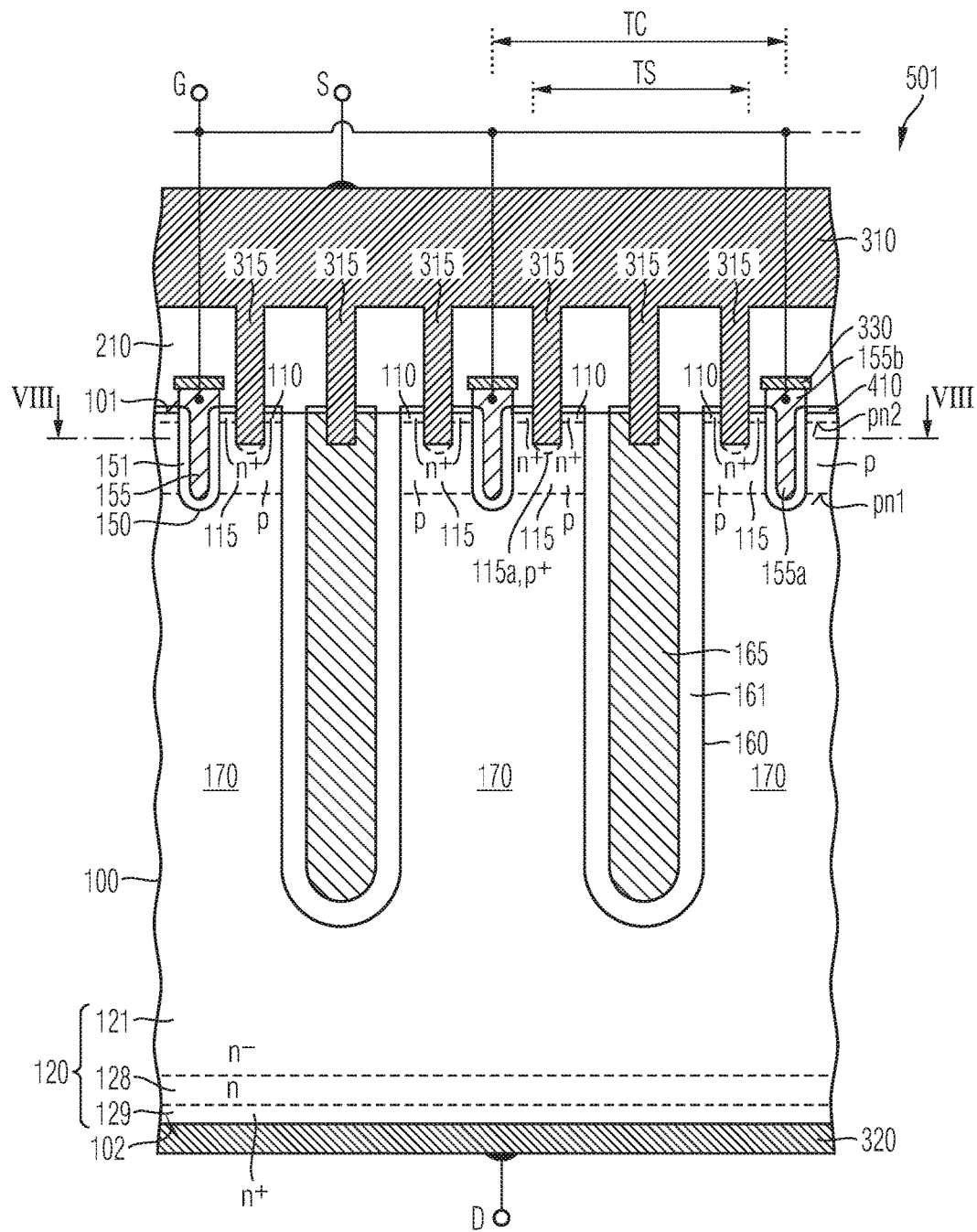
FIG. 7C is a schematic vertical cross-sectional view of a portion of an IGFET according to an embodiment including a gate wiring connecting separated gate structures.

A lithography process may form load contact openings extending through an interlayer dielectric including the inter-metal dielectric 212, the pre-metal dielectric 211 and, optionally, the screen oxide layer 410. Contact grooves may be etched into the semiconductor layer 100a in the vertical projection of the load contact openings to expose portions of the body zones 115, the source zones 110 and the field electrodes 165. Load contact structures 315 may be formed that fill the contact grooves in the semiconductor layer 100a and the load contact openings in the interlayer dielectric 210. A further metal layer may be deposited on the interlayer dielectric 210 and may be patterned to form a first load electrode 310 electrically connected to the source zones 110, the body zones 115 and the field electrodes 165 through the load contact structures 315 as illustrated in FIGS. 7A to 7C below.

From the further metal layer a gate pad may be formed side-by-side to the first load electrode 310 and inter-metal vias extending through the inter-metal dielectric 212 may electrically connect the gate pad with the gate wiring 330.

FIG. 6 refers to a semiconductor device 500 including a plurality of identical transistor cells TC. The semiconductor device 500 may be or may include an IGFET, for example a MOSFET (metal oxide semiconductor FET) in the usual meaning including FETs with metal gates as well as FETs with semiconductor gates. According to another embodiment, the semiconductor device 500 may be an IGBT (insulated gate bipolar transistor) or an MCD (MOS controlled diode).

The semiconductor device 500 is based on a semiconductor portion 100 from a single crystalline semiconductor material such as silicon (Si), silicon carbide (SiC), germanium (Ge), a silicon germanium crystal (SiGe), or an $A_{III}B_V$ semiconductor.

The semiconductor portion 100 has a first surface 101 which may be approximately planar or which may be defined by a plane spanned by coplanar surface sections as well as a planar second surface 102 parallel to the first surface 101. A distance between the first and second surfaces 101, 102 depends on a voltage blocking capability the semiconductor device 500 is specified for and may be at least 20 μm. According to other embodiments, the distance may be in the range of several hundred μm. A lateral outer surface tilted to the first and second surfaces 101, 102 connects the first and second surfaces 101, 102.

In a plane perpendicular to the cross-sectional plane the semiconductor portion 100 may have a rectangular shape with an edge length of several millimeters. A normal to the first surface 101 defines a vertical direction and directions orthogonal to the vertical direction are horizontal directions.

The semiconductor portion 100 includes a drift structure 120 of a first conductivity type as well as a contact portion 129 between the drift structure 120 and the second surface 102. The drift structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between $1E14$ $cm^{-3}$ and $1E18$ $cm^{-3}$, for example, in a range from $5E15$ $cm^{-3}$ to $1E17$ $cm^{-3}$. For a silicon-based semiconductor portion 100 the mean dopant concentration in the drift zone 121 may be between $1E15$ $cm^{-3}$ and $1E17$ $cm^{-3}$, for example, in a range from $5E15$ $cm^{-3}$ to $5E16$ $cm^{-3}$.

The contact portion 129 may be a heavily doped base substrate or a heavily doped layer. Along the second surface 102 a dopant concentration in the contact portion 129 is sufficiently high to form an ohmic contact with a metal directly adjoining the second surface 102. In case the semiconductor portion 100 is based on silicon, in an n-conductive contact portion 129 the dopant concentration along the second surface 102 may be at least $1E18$ $cm^{-3}$, for example at least $5E19$ $cm^{-3}$. In a p-conductive contact portion 129, the dopant concentration may be at least $1E16$ $cm^{-3}$, for example at least $5E17$ $cm^{-3}$. For IGFETs and semiconductor diodes, the contact portion 129 has the same conductivity as the drift zone 121. For IGBTs the contact portion 129 may have the complementary second conductivity type or may include zones of both conductivity types.

The drift structure 120 may include further doped regions, e.g., a field stop layer or a buffer zone between the drift zone 121 and the contact portion 129, barrier zones as well as counterdoped regions.

A gate structure 150 extends from the first surface 101 into the semiconductor portion 100. The gate structure 150 may form a regular stripe pattern including regularly arranged gate stripes separating transistor sections TS of the semiconductor portion 100. According to an embodiment the gate structure 150 forms a grid pattern and meshes of the grid surround the transistor sections TS of the semiconductor portion 100. The gate structure 150 includes a conductive gate electrode 155, which includes or consists of a heavily doped polycrystalline silicon layer and/or a metal-containing layer. The gate electrode 155 is insulated against the semiconductor portion 100, wherein a gate dielectric 151 may separate the gate electrode 155 from at least portions of the semiconductor portion 100.

The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or any combination thereof. The gate electrode 155 may be electrically connected or coupled to a gate terminal G of the semiconductor device 500 or to an output of an internal driver circuit.

The vertical extension of the gate structures 150 may be in a range from 100 nm to 5000 nm, for example in a range from 300 nm to 1000 nm. A width of the gate structure 150 may be at least 150 nm, for example at least 200 nm.

Spicular field plate structures 160 extend from the first surface 101 into the transistor sections TS of the semiconductor portion 100. Portions of the spicular field plate structures 160 between the first surface 101 and buried end portions may have approximately vertical sidewalls or may slightly taper at an angle of, e.g., 89 degree with respect to the first surface 101. The sidewalls may be straight or slightly bulgy.

The field plate structures 160 are needle-shaped with dot-shaped horizontal cross-section areas. A plurality of spicular field plate structures 160 with the same horizontal cross-sectional area may be arranged along parallel lines.

The field plate structures 160 include a conductive field electrode 165 and a field dielectric 161 surrounding the field electrode 165, respectively. The field electrode 165 includes or consists of a heavily doped silicon layer and/or a metal-containing layer. The field dielectric 161 separates the field electrode 165 from the surrounding semiconductor material of the semiconductor portion 100 and may include or consist of a thermally grown silicon oxide layer, a deposited silicon oxide layer, e.g., a silicon oxide based on TEOS, or any combination thereof.

A vertical extension of the spicular field plate structures 160 is greater than that of the gate structures 150 and smaller than a distance between the first surface 101 and the contact portion 129 such that a continuous drift zone section 121b is formed between the field plate structures 160 and the contact portion 129 and such that a perforated drift zone section 121a horizontally embeds the field plate structures 160. The vertical extension of the field plate structures 160 may be in a range from 1 µm to 50 µm, for example in a range from 2 µm to 20 µm. A first horizontal extension of the field plate structures 160 may be in a range from 0.1 µm to 20 µm, for example in a range from 0.2 µm to 5 µm.

A second horizontal extension of the field electrode 165 orthogonal to the first horizontal extension may be at most three times or at most twice as large as the first horizontal extension, wherein the cross-sectional areas of the field electrodes 165 and the field plate structures 160 may be rectangles, regular polygons, distorted polygons with or without rounded and/or beveled corners, ellipses or ovals, respectively.

According to an embodiment, the first and second horizontal extensions are at least approximately equal and the cross-sectional areas of the field electrodes 165 and the field plate structures 160 are circles or regular polygons with or without rounded or beveled corners, such as octagons, hexagons or squares.

The field plate structures 160 facilitate high dopant concentrations in the drift zone 121 without adverse impact on the blocking capability of the semiconductor device 500. Needle-shaped field electrodes 165 increase the available cross-sectional area for the drift zone 121 and therefore reduce the on-state resistance RDSon compared to stripe-shaped field electrodes.

The transistor sections TS, which include the semiconducting portions of the transistor cells TC, protrude from a continuous section of the semiconductor portion 100 between the field plate structures 160 and the second surface 102 and include the perforated drift zone section 121a. A horizontal mean width of the transistor sections TS may be in a range from 0.2 µm to 10 µm, for example in a range from 0.3 µm to 1 µm.

Mesa sections 170 of the semiconductor portion 100 between the field plate structures 160 include body zones 115 of the second conductivity type. The body zones 115 form first pn junctions pn1 with the drift structure 120, e.g., with the perforated drift zone section 121a, and second pn junctions pn2 with source zones 110 formed between the body zones 115 and the first surface 101. A distance between the first pn junctions pn1 and the first surface 101 may be equal to or smaller than a vertical extension of the gate structures 150. The body zones 115 completely surround the field plate structures 160 in a horizontal plane. The gate dielectric 151 capacitively couples the gate electrode 155 to channel portions of the body zones 115.

The source zones 110 may be wells extending from the first surface 101 into the semiconductor portion 100, for example into the body zones 115. One source zone 110 may surround the respective spicular field plate structure 160 in a horizontal plane or two or more separated source zones 110 may be formed in each transistor section TS. The source zones 110 may be spaced from the spicular field plate structures 160 or may directly adjoin to the spicular field plate structures 160.

The field electrodes 165, the source zones 110 as well as the body zones 115 are electrically connected to a first load electrode 310. The first load electrode 310 may be electrically coupled or connected to a first load terminal L1, which is, for example, a source terminal in case the semiconductor device 500 is an IGFET, an emitter terminal in case the semiconductor device 500 is an IGBT or an anode terminal in case the semiconductor device 500 is a semiconductor diode.

A second load electrode 320, which directly adjoins to the second surface 102 and to the contact portion 129, may form or may be electrically connected to a second load terminal L2, which may be a drain terminal in case the semiconductor device 500 is an IGFET, a collector terminal in case the semiconductor device 500 is an IGBT or a cathode terminal in case the semiconductor device 500 is a semiconductor diode.

In the illustrated embodiments and for the following description, the body zones 115 are p-type and the source zones 110 as well as the drift zone 121 are n-type. Similar considerations as outlined below apply also to embodiments with n-type body zones 115 in combination with p-type source zones 110 as well as a p-type drift zone 121.

When a gate voltage applied to the gate electrode 155 exceeds a threshold voltage, electrons accumulate in the channel portions of the body zones 115 directly adjoining the gate dielectric 151 and form inversion channels bypassing the second pn-junctions pn2 for electrons in a forward biased state of the semiconductor device 500 with a positive voltage applied between the drift structure 120 and the source zones 110. In response to a gate voltage that exceeds the threshold voltage, a load current flows between the first and second load terminals L1, L2 in the vertical direction through the semiconductor portion 100.

The gate electrode 155 includes a first portion 155a extending from the first surface 101 into the mesa section 170 and a second portion 155b protruding from the first surface 101 and projecting into the interlayer dielectric 210. The second portion 155b is wider than a corresponding width of the first portion 155a such that the second portion 155b significantly reduces the ohmic resistance of the gate electrode in the horizontal directions. Since the vertical extension of the second portion 155b can be precisely defined by the thickness of a highly conformal protection layer as discussed above, the resistance of the gate electrodes 155 is highly uniform across the semiconductor device 500.

A screen oxide layer 410 may cover at least the mesa sections 170. The screen oxide layer 410 may be a thermally grown silicon oxide layer with a thickness in a range from 5 nm to 30 nm, for example from 10 nm to 15 nm. The screen oxide layer 410 is formed prior to the gate structures 150 and allows for shallow implants, e.g., for the formation of the source zones 110 and/or the body zones 115.

For example, a distance between the second pn junctions pn2 and the first surface 101 is less than 200 nm, for example less than 150 nm. A low vertical extension of the source zones 110 reduces gate charge and allows for reducing the vertical dimensions of the gate structures 150.

A distance between the first pn junctions pn1 and the first surface 101 is less than 800 nm. A low vertical extension of the body zones 115 allows for reducing the vertical dimensions of the gate structures 150 and the field plate structures 160 and reduces process complexity.

FIGS. 7A to 7C show an IGFET 501 based on a semiconductor portion 100 including transistor cells TC with spicular field plate structures 160 and gate structures 150 as described in detail with respect to FIG. 6, wherein the first load terminal is a source terminal S and the second load terminal is a drain terminal D.

An interlayer dielectric 210 is formed on the first surface 101 of the semiconductor portion 100 and electrically separates the gate electrodes 155 from the first load electrode 310. The interlayer dielectric 210 may include one homogenous layer or a layer stack including two or more sub-layers of different dielectric materials such as thermal silicon oxide, deposited oxide such as LPCVD (low pressure chemical vapor deposition) silicon oxide, silicon oxynitride, silicon nitride, or a silicate glass, e.g., undoped silicate glass, BSG, PSG, or BPSG.

Each of the first and second load electrodes 310, 320 may be a metal structure that consists of or contains, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

Contact structures 315 extend through openings in the interlayer dielectric 210 and electrically connect the first load electrode 310 with the source zones 110, the body zones 115 and the field electrodes 165. The contact structures 315 may include one or more conductive metal containing layers, e.g., diffusion barrier layers and/or adhesive layers, which are based on, e.g., titanium or tantalum as well as a metal fill layer containing, e.g., sputtered tungsten. Vertical center axes of some of the contact structures 315 may approximately coincide with vertical center axes of the field plate structures 160, wherein a displacement between the vertical axes is within a lithographic overlay tolerance.

The drift structure 120 may include a field stop layer 128 sandwiched between the drift zone 121 and the contact portion 129. The field stop layer 128 has the conductivity type of the drift zone 121. A mean dopant concentration in the field stop layer 128 may be at least five times as high as in the drift zone 121 and at most one-fifth of a maximum dopant concentration in the contact portion 129.

The body zones 115 may include heavily doped contact zones 115a directly adjoining to the contact structures 315, wherein the heavily doped contact zones 115a form an ohmic contact with the contact structures 315.

In FIG. 7A the interlayer dielectric 210 of the IGFET 501 includes a screen oxide layer 410 formed at least on the mesa sections 170. The gate electrode 155 includes a first portion 155a extending from the first surface 101 into the mesa sections 170 and a second portion 155b protruding from the first surface 101 and projecting into the interlayer dielectric 210.

In the IGFET 501 of FIG. 7B a screen oxide layer is removed before formation of the interlayer dielectric 210 and the interlayer dielectric 210 is devoid of a thermal oxide with a thickness in a range from 10 nm to 30 nm.

In FIG. 7C a gate wiring 330 directly formed on the protruding second portions 155b of separated gate electrodes 155 electrically connects the first portions 155a of the separated gate electrodes 155.

Figure 8A:
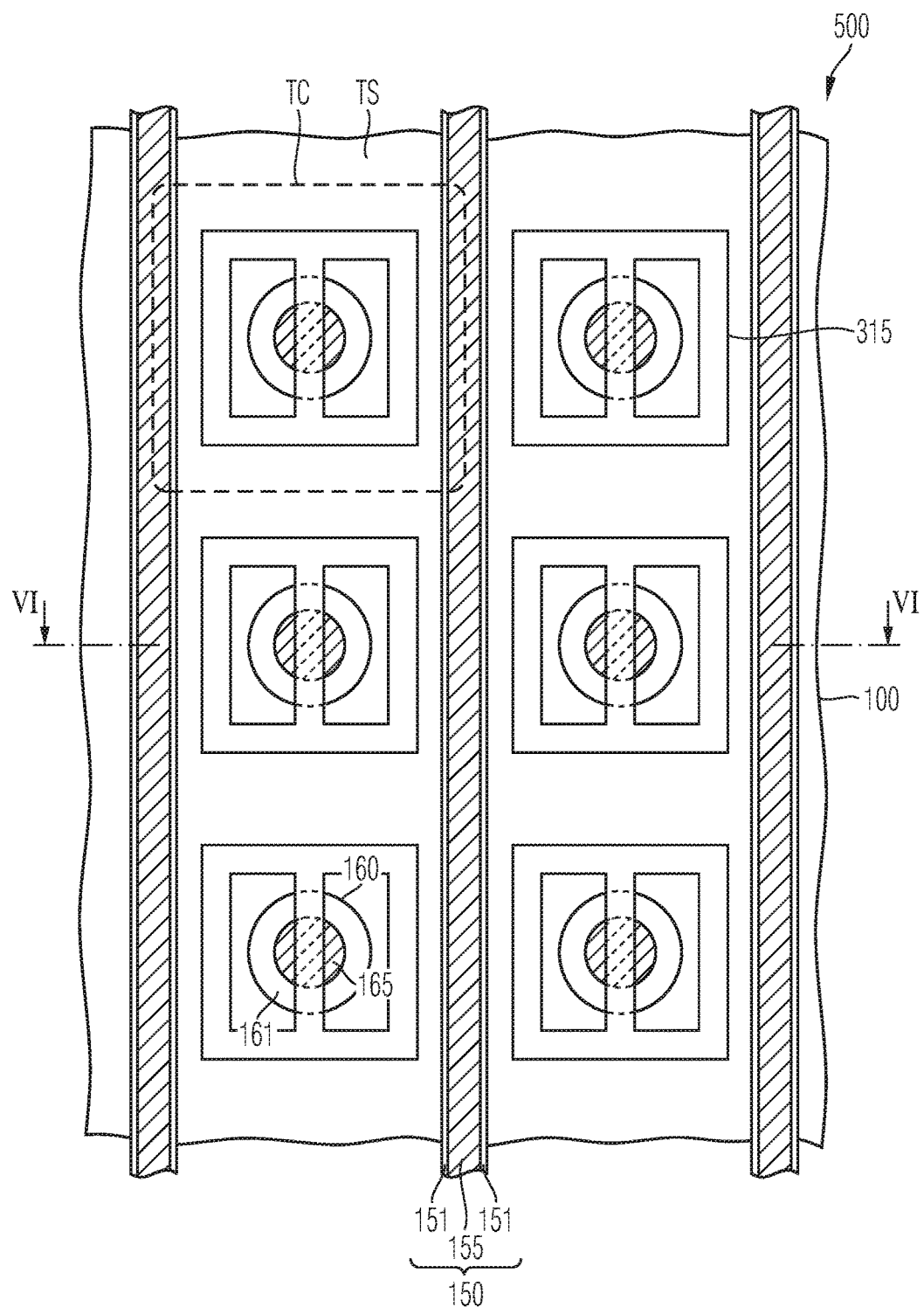
FIG. 8A is a schematic horizontal cross-sectional view of a portion of a semiconductor device according to another embodiment including stripe-shaped gate structures arranged between neighboring lines of needle-shaped field plate structures.
Figure 8B:
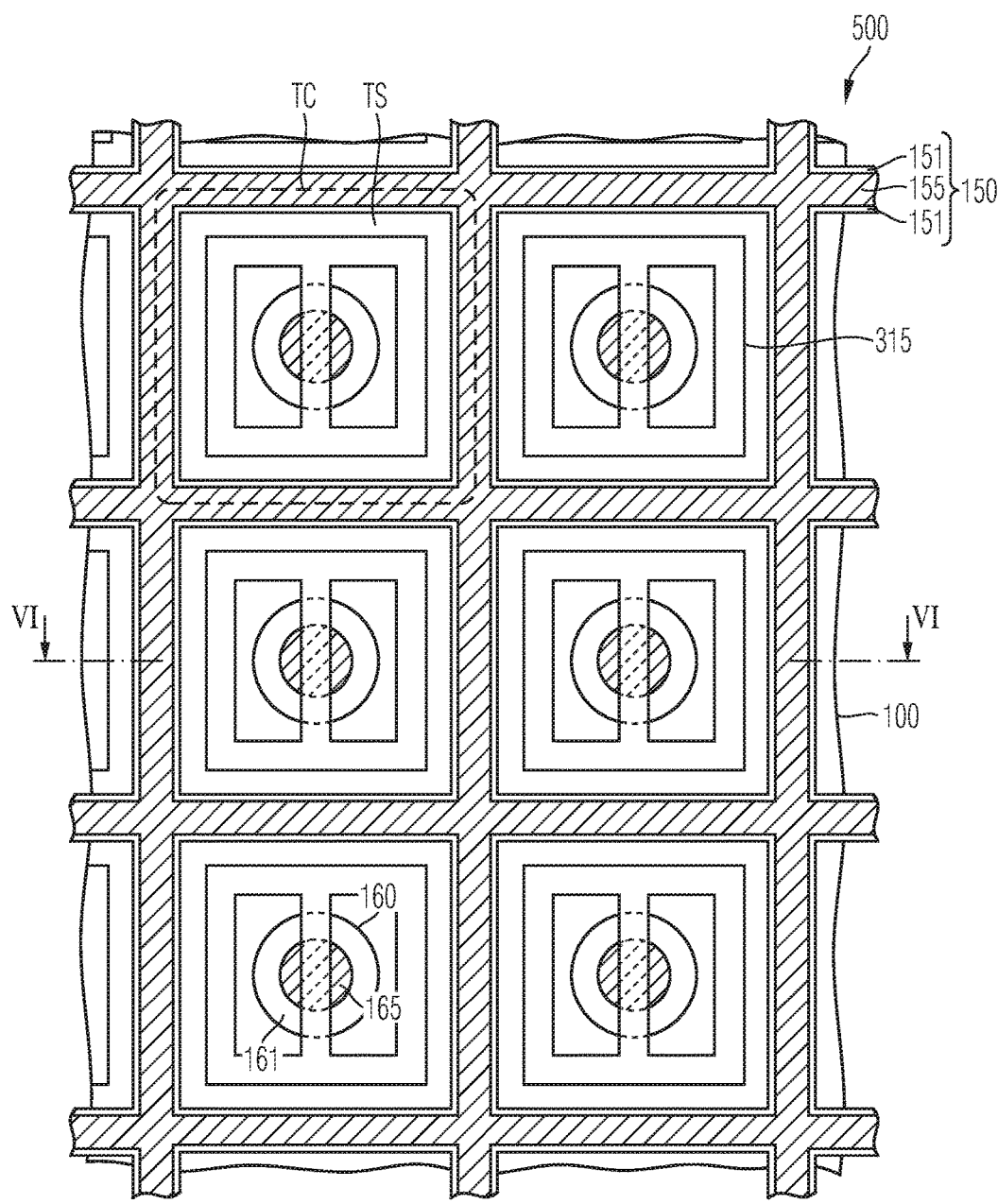
FIG. 8B is a schematic horizontal cross-sectional view of a portion of a semiconductor device according to an embodiment including a gate structure forming a continuous grid pattern.
Figure 8C:
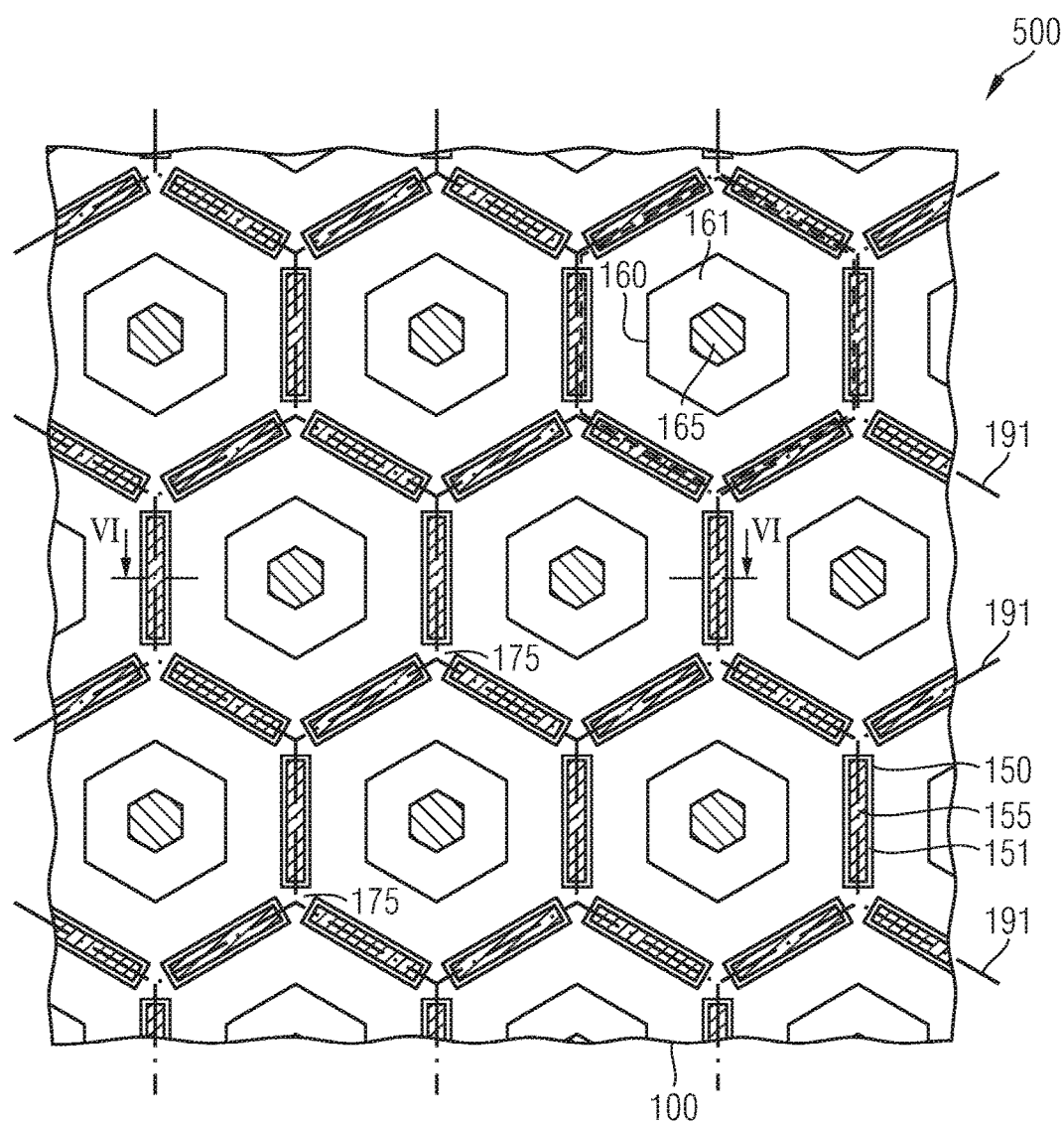
FIG. 8C is a schematic horizontal cross-sectional view of a portion of a semiconductor device according to an embodiment with separated gate structures arranged along lines of a hexagonal grid.

FIGS. 8A to 8C illustrate different layouts for the gate structures 150 and field plate structures 160 and refer to cross-sections along lines VIII-VIII in FIG. 6 and FIGS. 7A to 7C.

FIG. 8A shows an embodiment of a layout with stripe-shaped gate structures 150 between and parallel to neighboring lines of needle-shaped field plate structures 160.

FIG. 8B shows an embodiment of a layout with needle-shaped field plate structures 160 arranged matrix-like in lines and rows and a continuous gate structure 150 forming a grid with one single needle-shaped field plate structure 160 arranged in each mesh.

FIG. 8C shows an embodiment referring to separated gate electrodes formed along grid-lines 191, wherein the grid-lines form a hexagonal grid.

Figure 9:
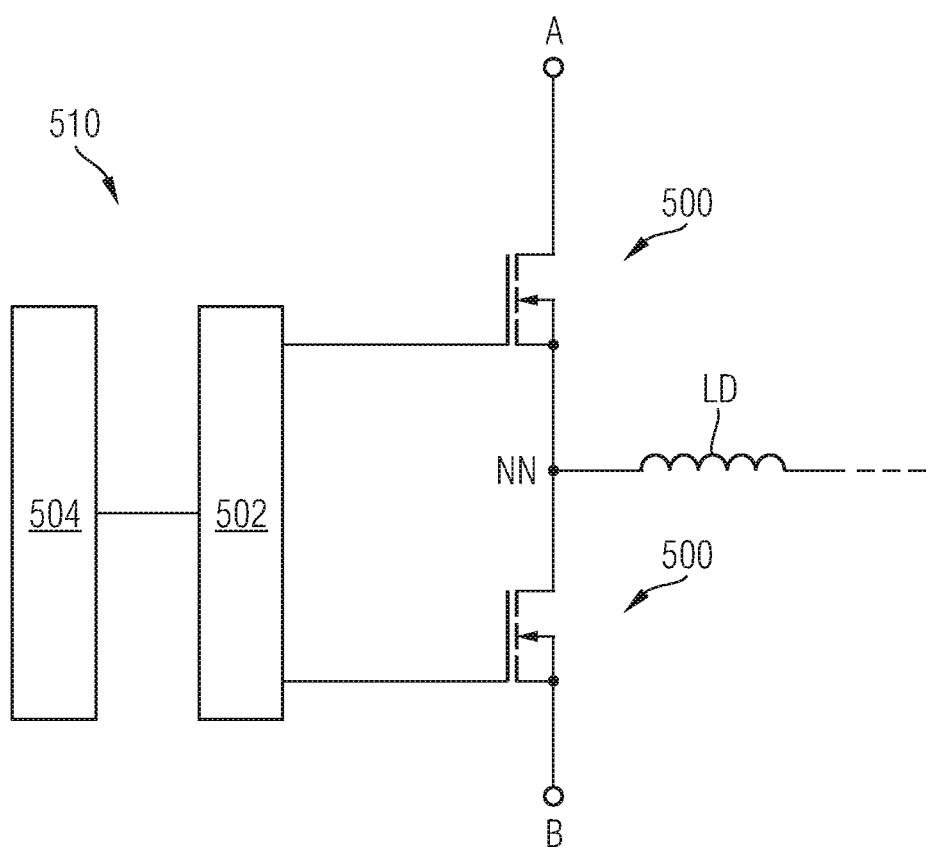
FIG. 9 is a schematic circuit diagram of an electronic assembly according to an embodiment related to switch-mode power supplies and motor drives.

FIG. 9 refers to an electronic assembly 510 that may be a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 510 may include two identical semiconductor devices 500 as described above. The semiconductor devices 500 may be IGFETs and the load paths of the two semiconductor devices 500 are electrically connected in series between a first supply terminal A and a second supply terminal B. The supply terminals A, B may supply a DC (direct-current) voltage or an AC (alternating-current) voltage. The network node NN between the two semiconductor devices 500 may be electrically connected to an inductive load, which may be a winding of a transformer or a motor winding, or to a reference potential of an electronic circuit, by way of example. The electronic assembly 510 may further include a control circuit 504 configured to supply a control signal for alternately switching on and off the semiconductor devices 500 and a gate driver 502 controlled by the control circuit 504 and electrically connected to gate terminals of the semiconductor devices 500.

The electronic assembly 510 may be a motor drive with the semiconductor devices 500 electrically arranged in a half-bridge configuration, the network node NN electrically connected to a motor winding and the supply terminals A, B supplying a DC voltage.

According to another embodiment, the electronic assembly 510 may be a primary side stage of a switched mode power supply with the supply terminals A, B supplying an AC voltage of an input frequency to the electronic assembly 510. The network node NN is electrically connected to a primary winding of a transformer.

The electronic assembly 510 may be a synchronous rectifier of a switched mode power supply with the supply terminals A, B connected to a secondary winding of the transformer and the network node NN electrically connected to a reference potential of an electronic circuit at the secondary side of the switched mode power supply.

According to a further embodiment, the electronic assembly 510 may be a primary side stage of a DC-to-DC converter, e.g., a power optimizer or a micro-inverter for applications including photovoltaic cells with the supply terminals A, B supplying a DC voltage to the electronic assembly 510 and the network node NN electrically connected to an inductive storage element.

According to another embodiment, the electronic assembly 510 may be a secondary side stage of a DC-to-DC converter, e.g., a power optimizer or a micro-inverter for applications including photovoltaic cells, wherein the electronic assembly 510 supplies an output voltage to the supply terminals A, B and wherein the network node NN is electrically connected to the inductive storage element.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a gate structure extending from a first surface into a semiconductor portion and comprising a metal gate electrode and a gate dielectric separating the metal gate electrode from the semiconductor portion;
   an interlayer dielectric separating a first load electrode from the semiconductor portion, the interlayer dielectric comprising a screen oxide layer thinner than the gate dielectric; and
   a body zone and a source zone formed in the semiconductor portion and directly adjoining the gate structure.

2. The semiconductor device of claim 1, wherein the interlayer dielectric further comprises at least one of a silicon oxide and a silicate glass.

3. The semiconductor device of claim 1, wherein the gate electrode includes a first portion extending from the first surface into the semiconductor portion and a second portion extending from the first surface through the screen oxide layer and into a further portion of the interlayer dielectric.

4. The semiconductor device of claim 1, further comprising:
   field plate structures extending from the first surface into the semiconductor portion.

5. The semiconductor device of claim 4, wherein the gate structure forms a grid and the field plate structures are formed in meshes of the grid.

6. The semiconductor device of claim 4, wherein each field plate structure comprises an electrically conductive field electrode and a field dielectric that electrically insulates the field electrode from the semiconductor portion.

7. The semiconductor device of claim 6, wherein each field electrode is electrically connected to the source zone.

8. The semiconductor device of claim 1, wherein the gate structure includes a plurality of separated gate structure portions.

9. The semiconductor device of claim 1, wherein the gate dielectric is at least twice as thick as the screen oxide layer.

10. The semiconductor device of claim 1, wherein at least one of the source zone and the body zone directly adjoins the gate dielectric.

11. The semiconductor device of claim 1, wherein the screen oxide layer directly contacts the source zone at the first surface.

12. The semiconductor device of claim 11, wherein the screen oxide layer comprises an upper surface opposite from the first surface, and wherein the interlayer dielectric comprises an additional dielectric region disposed between the upper surface and the load electrode.

13. A semiconductor device, comprising:
    a gate structure extending from a first surface into a semiconductor portion and comprising a metal gate electrode and a gate dielectric separating the gate electrode from the semiconductor portion;
    an interlayer dielectric separating a first load electrode from the first surface, wherein the gate electrode includes a first portion extending from the first surface into the semiconductor portion and a second portion extending from the first surface into the interlayer dielectric; and
    a body zone and a source zone formed in the semiconductor portion and directly adjoining the gate structure, wherein the second portion of the gate electrode laterally covers and extends above the gate dielectric.

14. The semiconductor device of claim 13, wherein the interlayer dielectric comprises a screen oxide layer thinner than the gate dielectric.

15. The semiconductor device of claim 14, wherein the second portion of the gate electrode extends through the screen oxide layer and into the interlayer dielectric.

16. The semiconductor device of claim 14, wherein the gate dielectric is at least twice as thick as the screen oxide layer.

17. The semiconductor device of claim 13, wherein the interlayer dielectric comprises at least one of a silicon oxide and a silicate glass.

18. The semiconductor device of claim 13, further comprising:
    field plate structures extending from the first surface into the semiconductor portion.

19. The semiconductor device of claim 18, wherein the gate structure forms a grid and the field plate structures are formed in meshes of the grid.

20. The semiconductor device of claim 18, wherein each field plate structure comprises an electrically conductive field electrode and a field dielectric that electrically insulates the field electrode from the semiconductor portion.

21. The semiconductor device of claim 20, wherein each field electrode is electrically connected to the source zone.

22. The semiconductor device of claim 13, wherein the gate structure includes a plurality of separated gate structure portions.

* * * * *